(12) United States Patent
Kubo

(10) Patent No.: US 10,103,228 B2
(45) Date of Patent: Oct. 16, 2018

(54) SEMICONDUCTOR DEVICE HAVING A SUPER JUNCTION STRUCTURE

(71) Applicant: ROHM CO., LTD., Kyoto-shi, Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/461,018

(22) Filed: Mar. 16, 2017

(65) Prior Publication Data

US 2017/0288021 A1  Oct. 5, 2017

(30) Foreign Application Priority Data

Mar. 29, 2016  (JP) .................. 2016-066392

(51) Int. Cl.
| | |
|---|---|
| *H01L 29/06* | (2006.01) |
| *H01L 31/00* | (2006.01) |
| *H01L 29/10* | (2006.01) |
| *H01L 29/78* | (2006.01) |
| *H01L 29/66* | (2006.01) |
| *H01L 29/739* | (2006.01) |
| *H01L 29/167* | (2006.01) |
| *H01L 21/263* | (2006.01) |
| *H01L 21/268* | (2006.01) |

(52) U.S. Cl.
CPC ...... *H01L 29/1095* (2013.01); *H01L 29/0623* (2013.01); *H01L 29/0634* (2013.01); *H01L 29/167* (2013.01); *H01L 29/66712* (2013.01); *H01L 29/7395* (2013.01); *H01L 29/7802* (2013.01); *H01L 29/7804* (2013.01); *H01L 29/7811* (2013.01); *H01L 21/263* (2013.01); *H01L 21/268* (2013.01); *H01L 29/0696* (2013.01); *H01L 29/7813* (2013.01)

(58) Field of Classification Search
CPC ............. H01L 29/0634; H01L 29/0626; H01L 29/0619; H01L 29/0696; H01L 29/1095; H01L 29/0623; H01L 29/167; H01L 29/66712; H01L 29/7395; H01L 29/7802; H01L 29/7804; H01L 29/7811; H01L 29/7813; H01L 21/263; H01L 21/268
USPC .................................. 257/202, 205, 329, 17
See application file for complete search history.

(56) References Cited

U.S. PATENT DOCUMENTS

| | | | |
|---|---|---|---|
| 2013/0302957 A1* | 11/2013 | Nakajima | ........... H01L 29/0634 438/268 |
| 2014/0306283 A1* | 10/2014 | Nakajima | ........... H01L 29/7827 257/329 |

FOREIGN PATENT DOCUMENTS

| | | |
|---|---|---|
| JP | 2007251023 | 9/2007 |
| JP | 2015070185 | 4/2015 |

* cited by examiner

*Primary Examiner* — Duy T Nguyen
(74) *Attorney, Agent, or Firm* — Hamre, Schumann, Mueller & Larson, P.C.

(57) ABSTRACT

A semiconductor device includes a semiconductor layer, having a drain region, a body region, and a source region, a gate electrode, facing the body region via a gate insulating film, a first pillar layer disposed inside the semiconductor layer so as to be continuous to the body region, and a trap level region, disposed inside the semiconductor layer and containing charged particles that form a trap level, and an electric field concentration portion, where an electric field concentrates in an off state in which a channel is not formed in the body region, and the trap level region are disposed at mutually different depth positions in a depth direction of the first pillar layer.

12 Claims, 27 Drawing Sheets

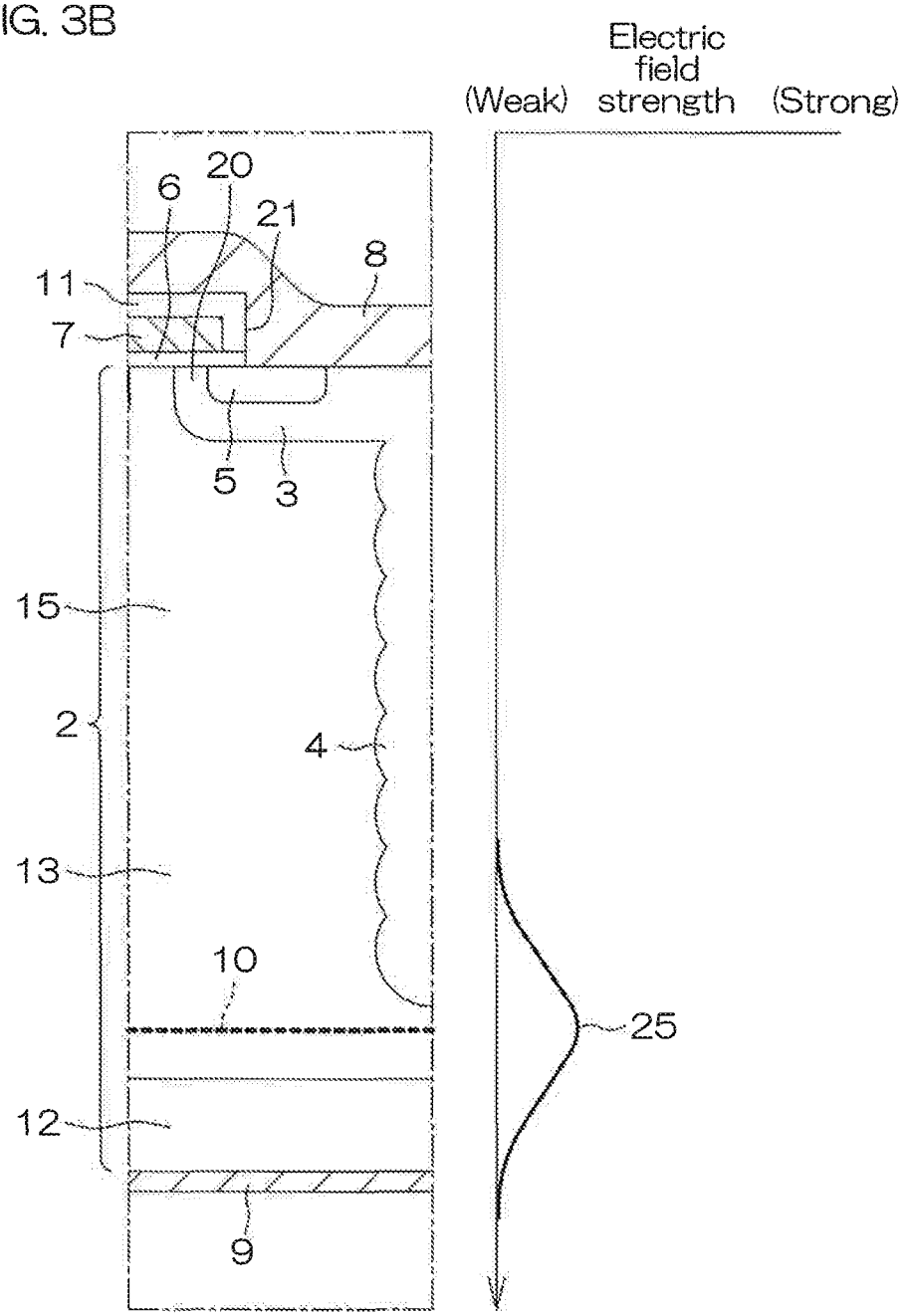

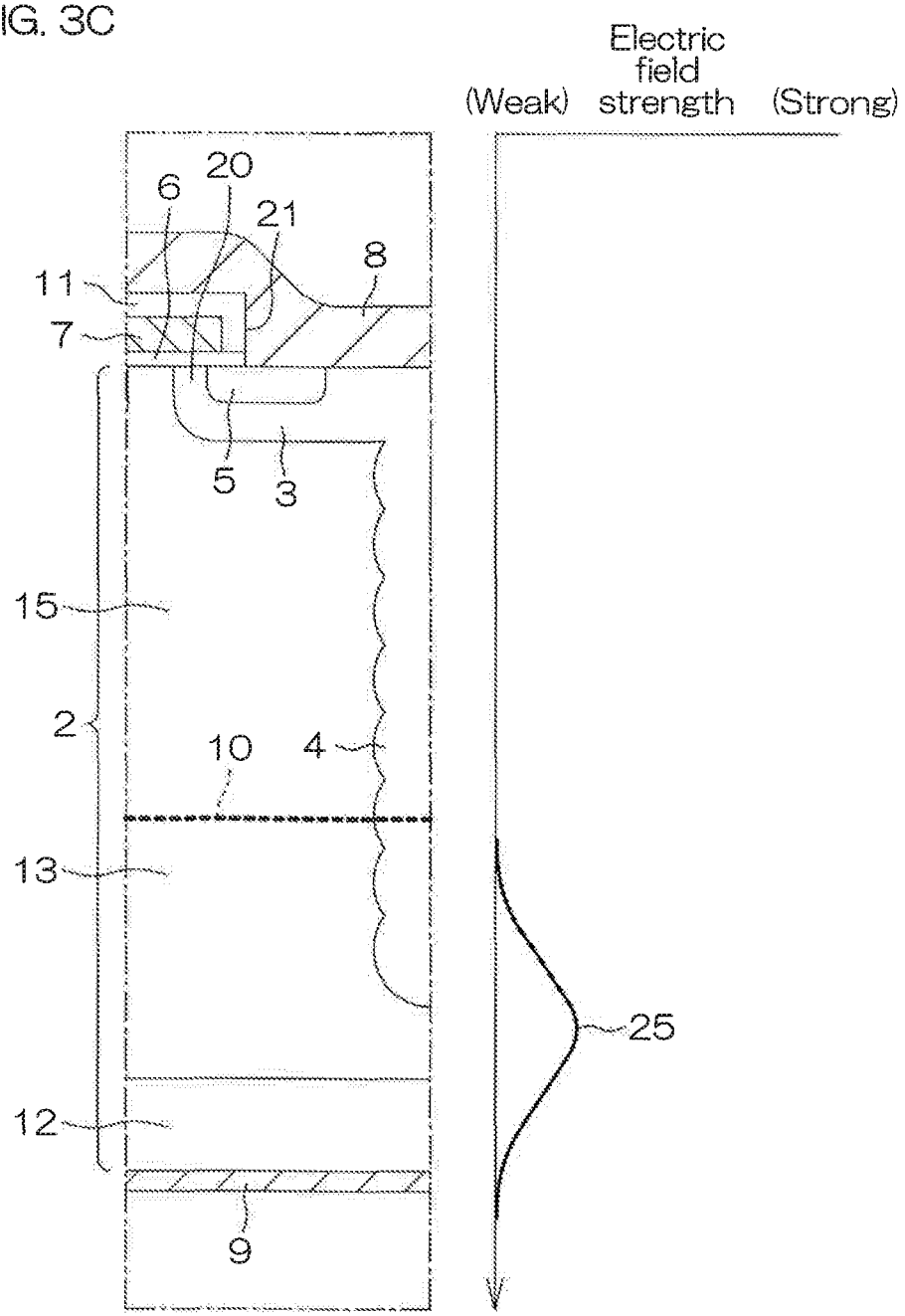

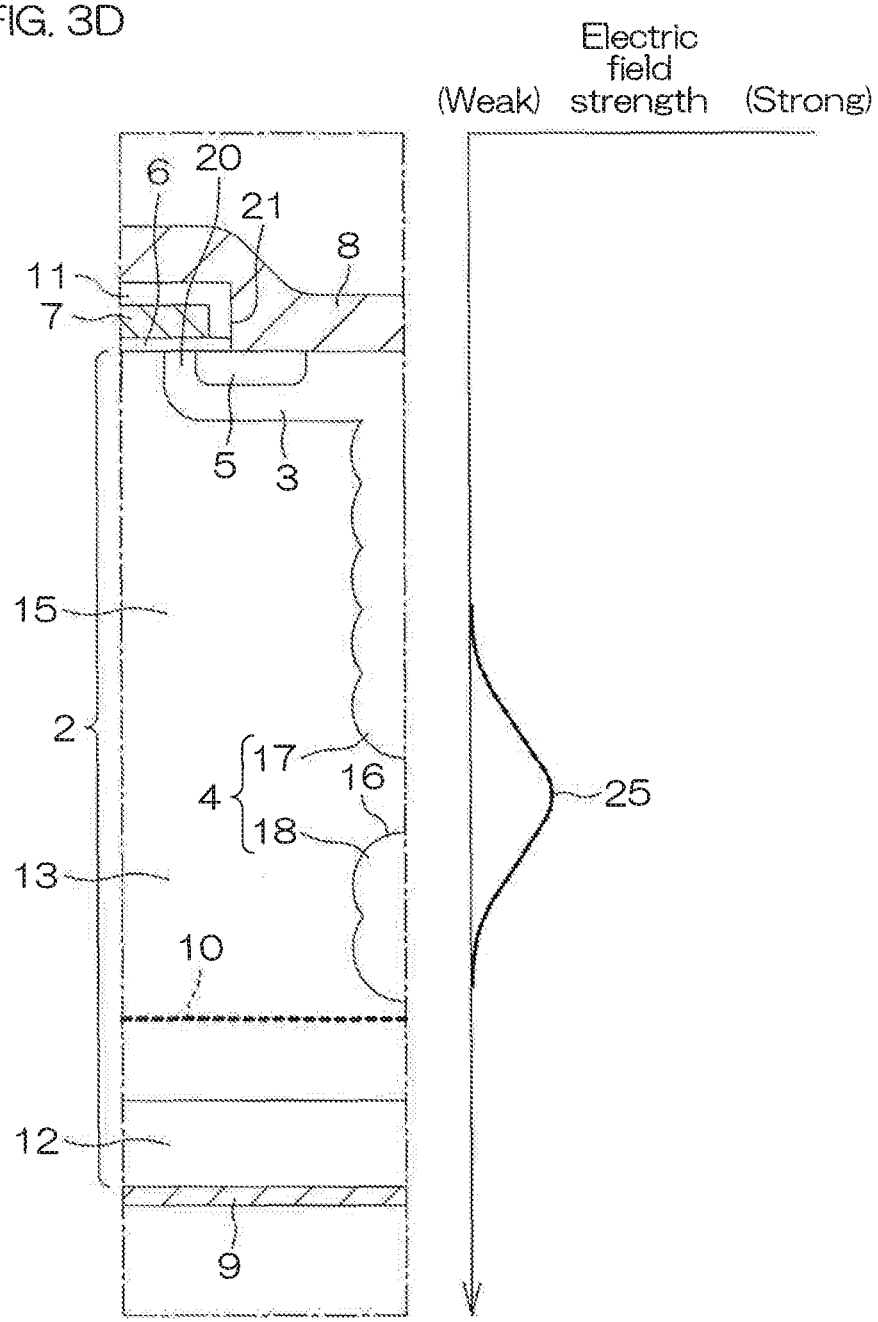

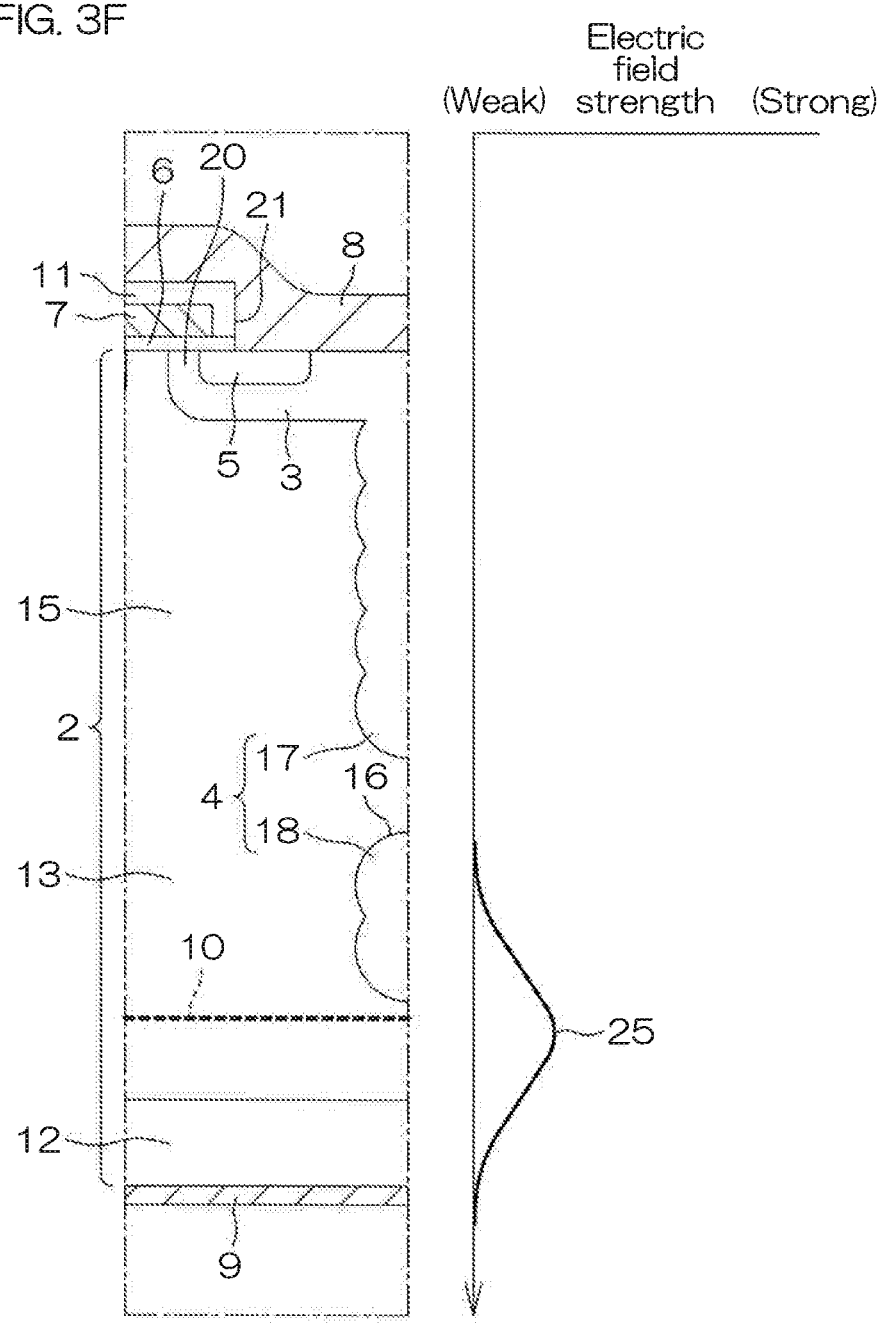

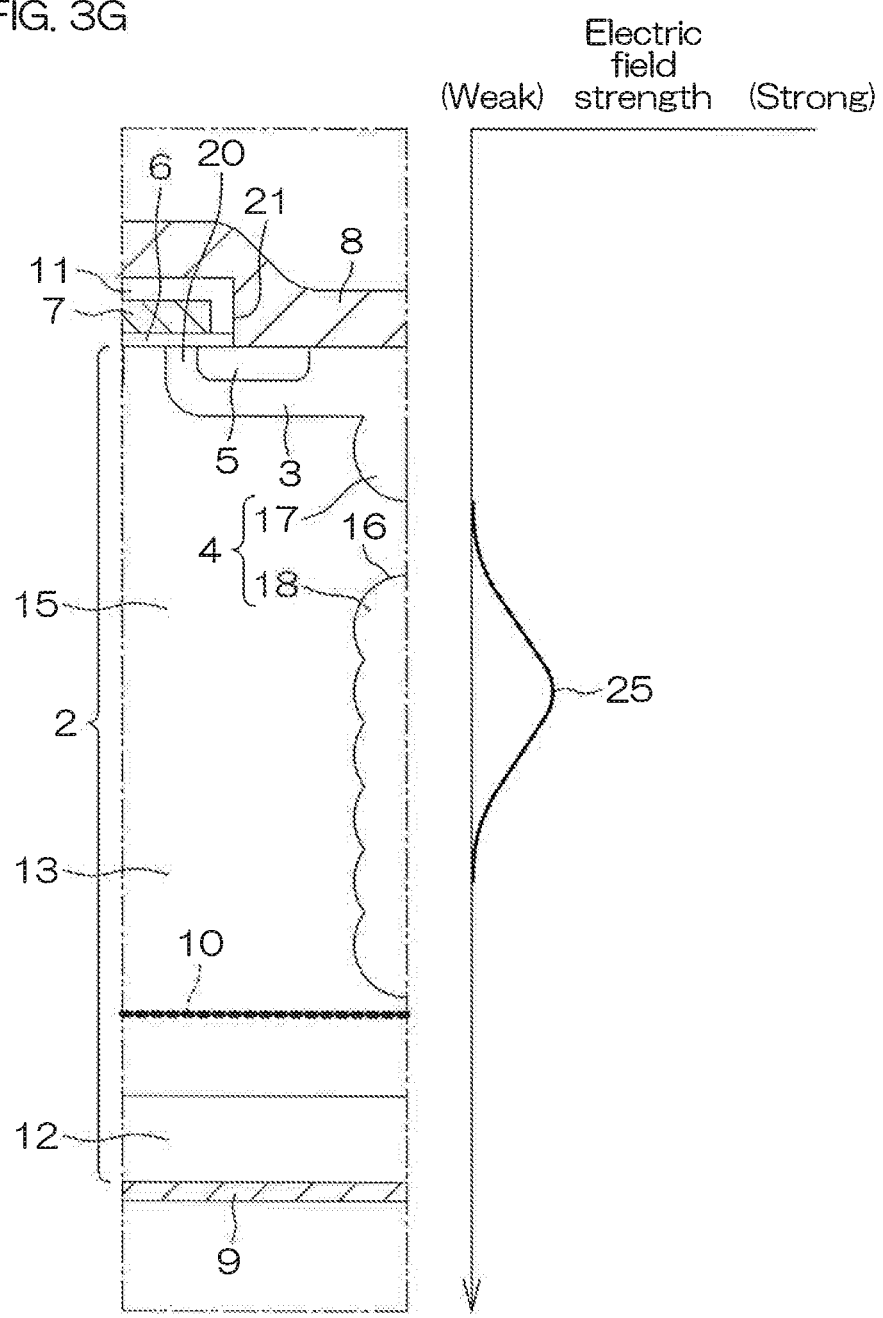

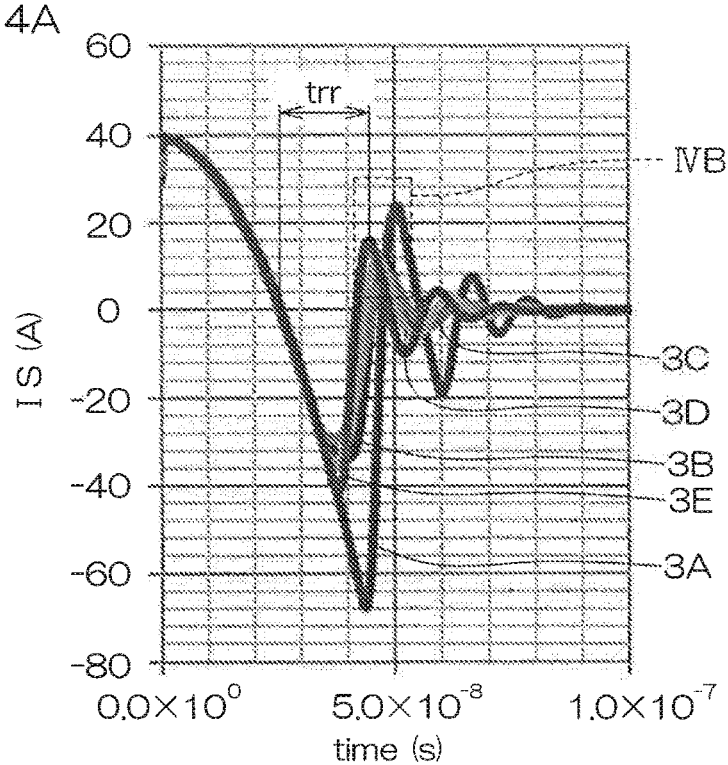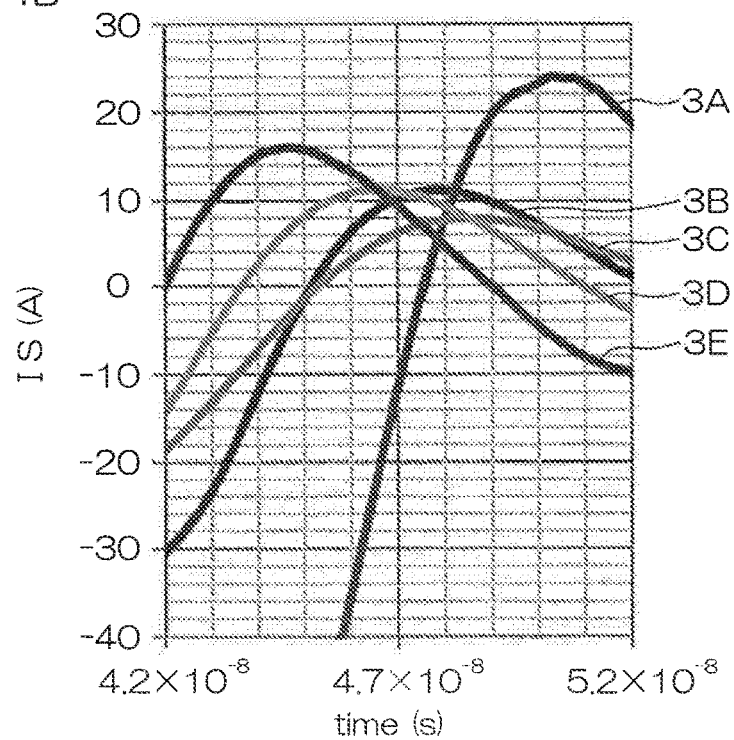

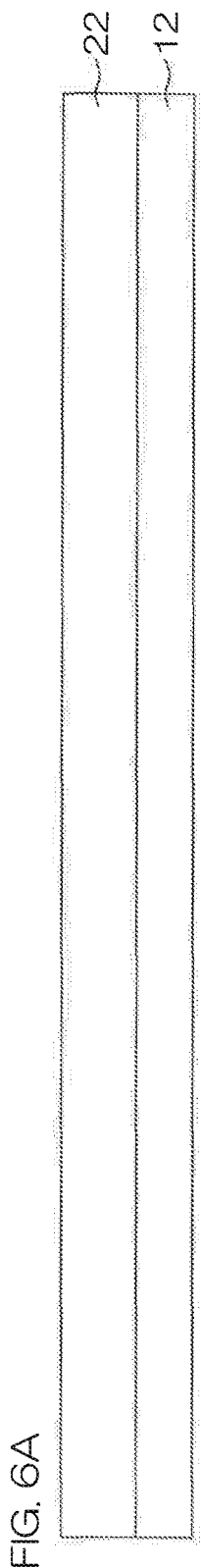

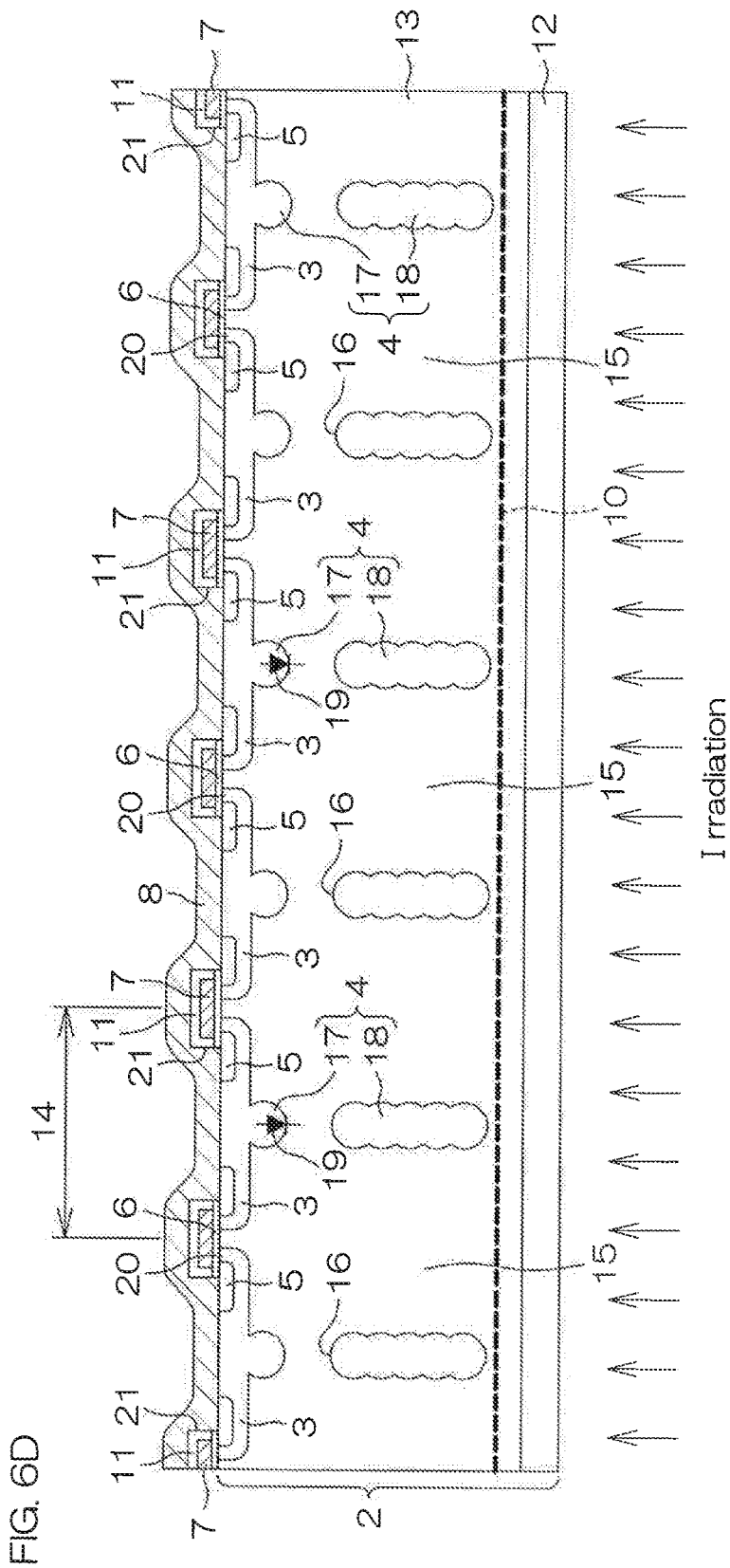

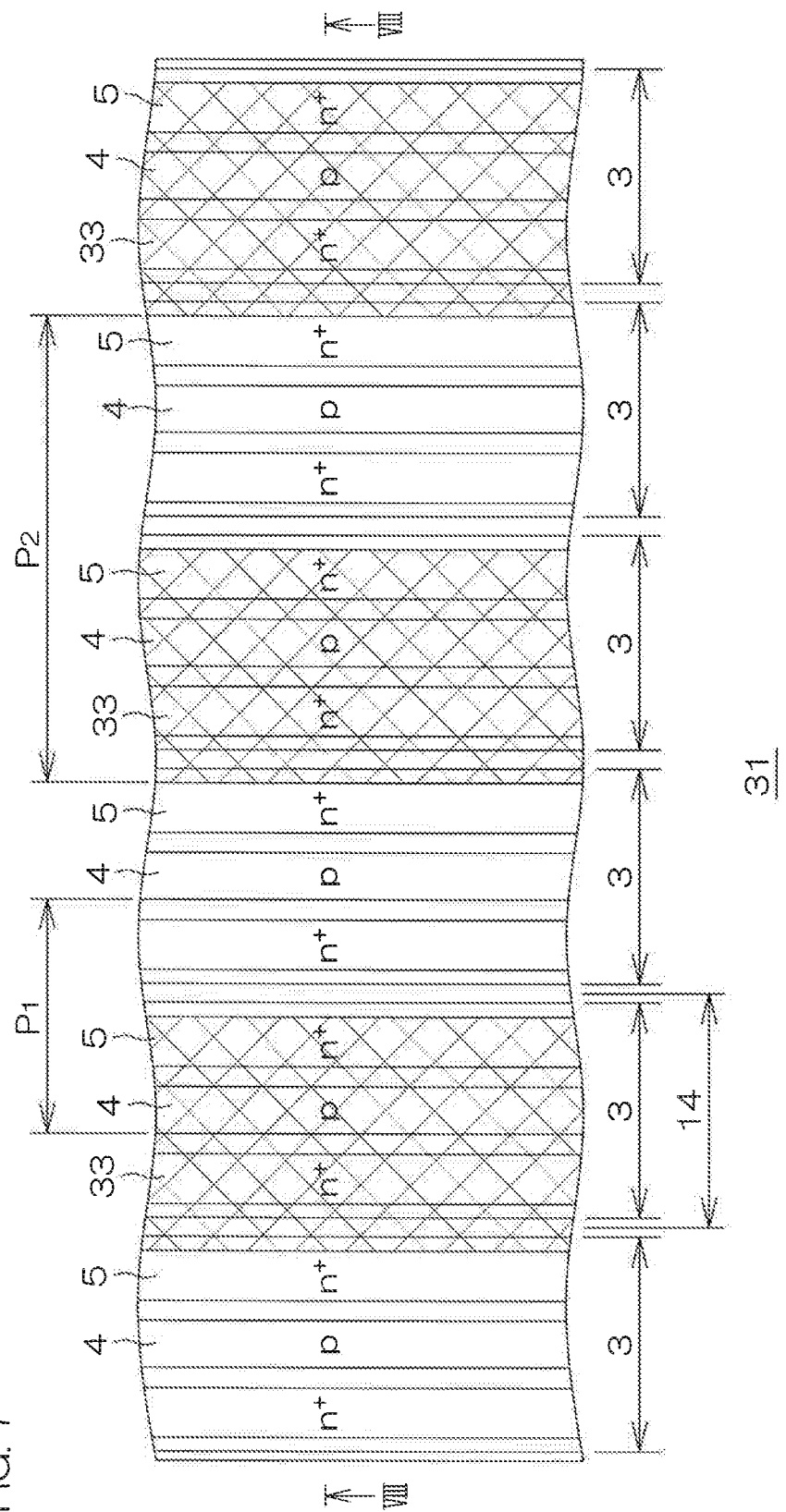

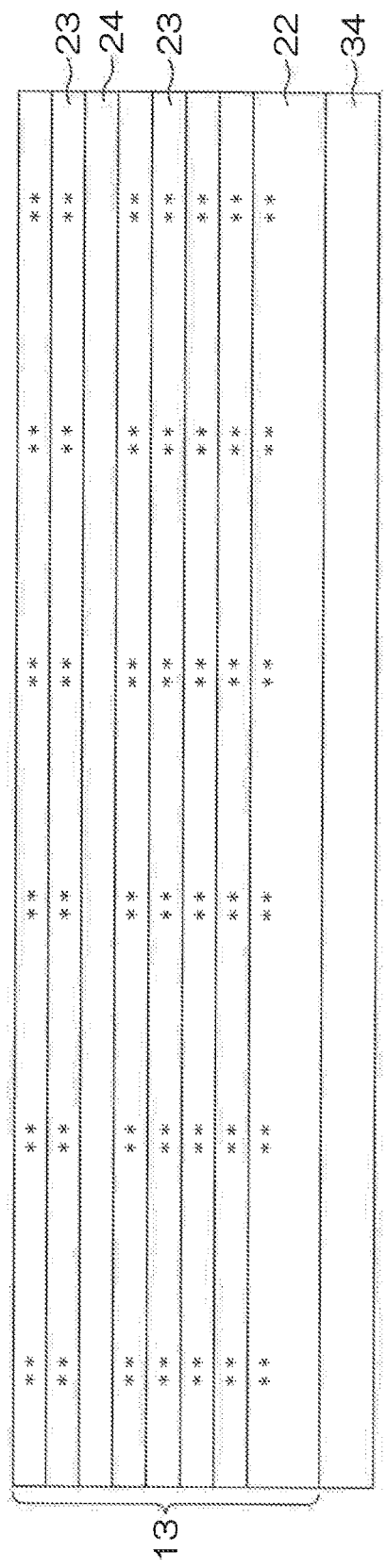

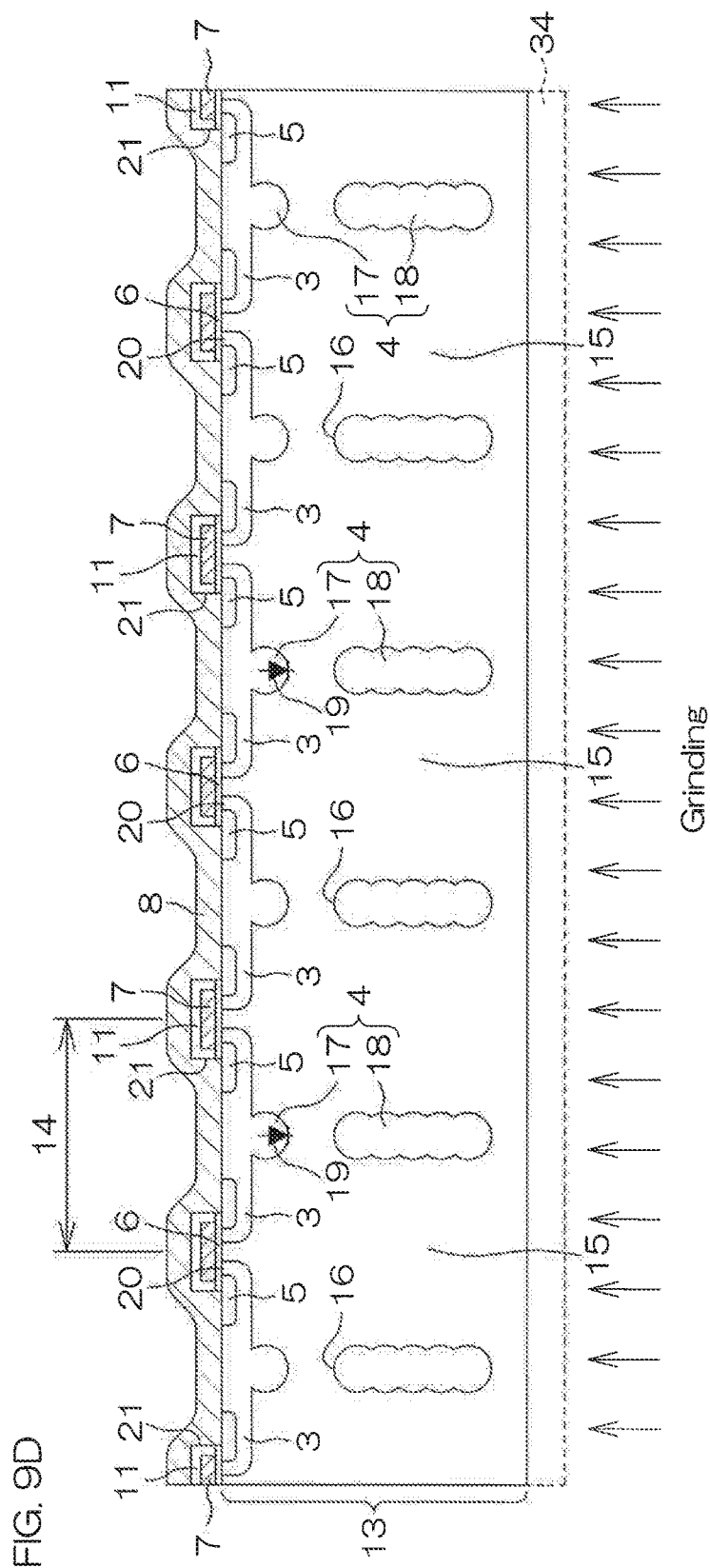

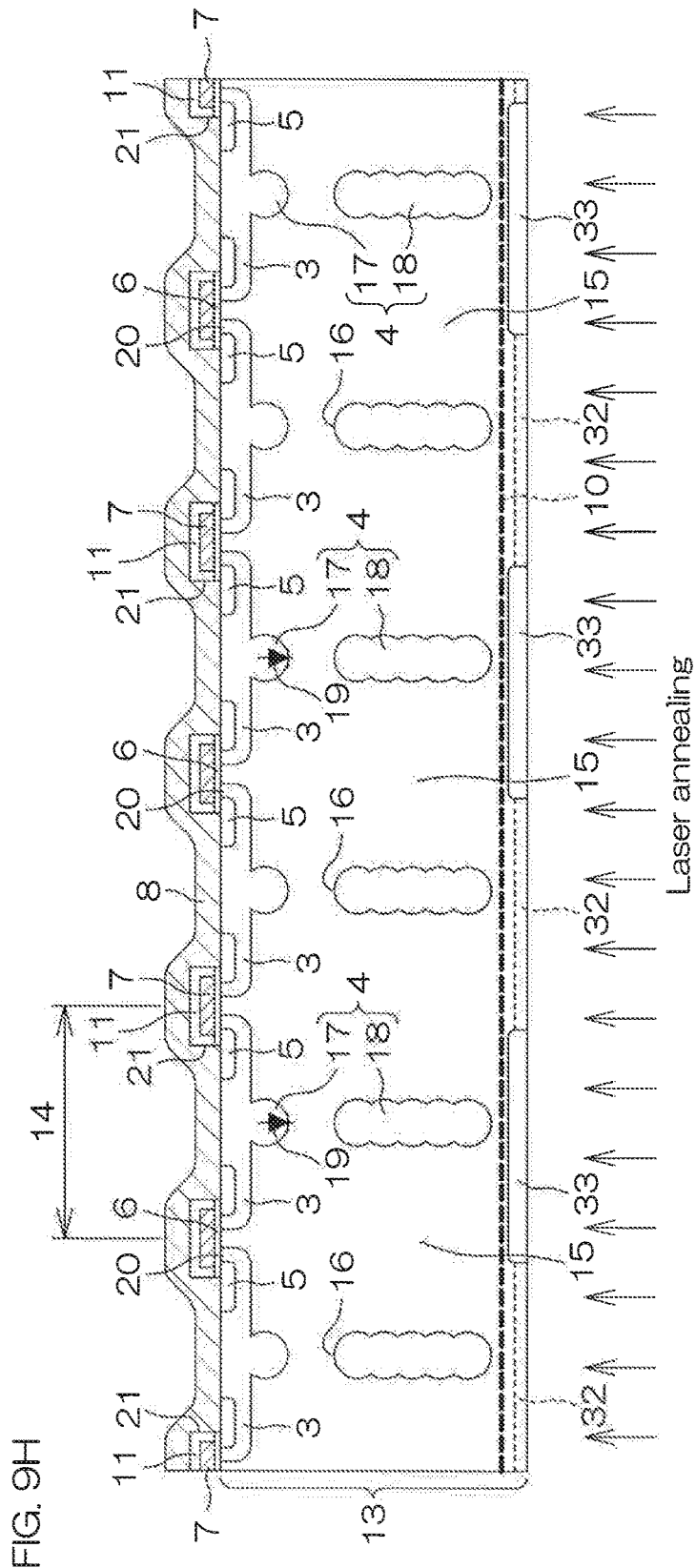

SEMICONDUCTOR DEVICE HAVING A SUPER JUNCTION STRUCTURE

CROSS-REFERENCE TO RELATED APPLICATIONS

The present application corresponds to Japanese Patent Application No. 2016-066392 filed in the Japan Patent Office on Mar. 29, 2016, and the entire disclosure of this application is incorporated herein by reference.

TECHNICAL FIELD

The present invention relates to a semiconductor device having a super junction structure.

BACKGROUND ART

For example, a super junction type MOSFET is known as an element used in an inverter circuit or a power supply circuit.

For example, Patent Document 1 (Japanese Patent Application Publication No. 2015-70185) discloses a semiconductor device including a semiconductor region of a first conductivity type, disposed in an element region and an outer peripheral region, a plurality of first columnar regions of a second conductivity type, disposed in an interior of the semiconductor region in the element region, and a plurality of second columnar regions of the second conductivity type, disposed in an interior of the semiconductor region in the outer peripheral region. By the first columnar regions and the second columnar regions being disposed, a plurality of pn junctions are formed inside the semiconductor region. The semiconductor device thus has a super junction structure in which the first columnar regions and the second columnar regions are disposed alternately.

SUMMARY OF INVENTION

In a MOSFET with a super junction structure, a trap level, due to a crystal defect formed by irradiating a substrate with charging particles, may be formed for the purpose of shortening a reverse recovery time trr.

An object of the present invention is to provide a semiconductor device having a super junction structure enabling shortening of the reverse recovery time trr while securing voltage withstand capability.

BRIEF DESCRIPTION OF DRAWINGS

FIG. 3A to FIG. 3H are diagrams of positional relationships of an electric field concentration portion and a trap level region in an n type semiconductor layer.

FIG. 4A shows waveforms of current reverse recovery characteristics under the conditions of FIG. 3A to FIG. 3E.

FIG. 4B is an enlarged view of a region surrounded by broken lines IVB in FIG. 4A.

FIG. 6A to FIG. 6D are diagrams showing portions of a process for manufacturing the semiconductor device of FIG. 1 and FIG. 2.

FIG. 7 is a schematic plan view of a semiconductor device according to another preferred embodiment of the present invention.

FIG. 9A to FIG. 9H are diagrams showing portions of a process for manufacturing the semiconductor device of FIG. 7 and FIG. 8.

DESCRIPTION OF EMBODIMENTS

Figure 1:
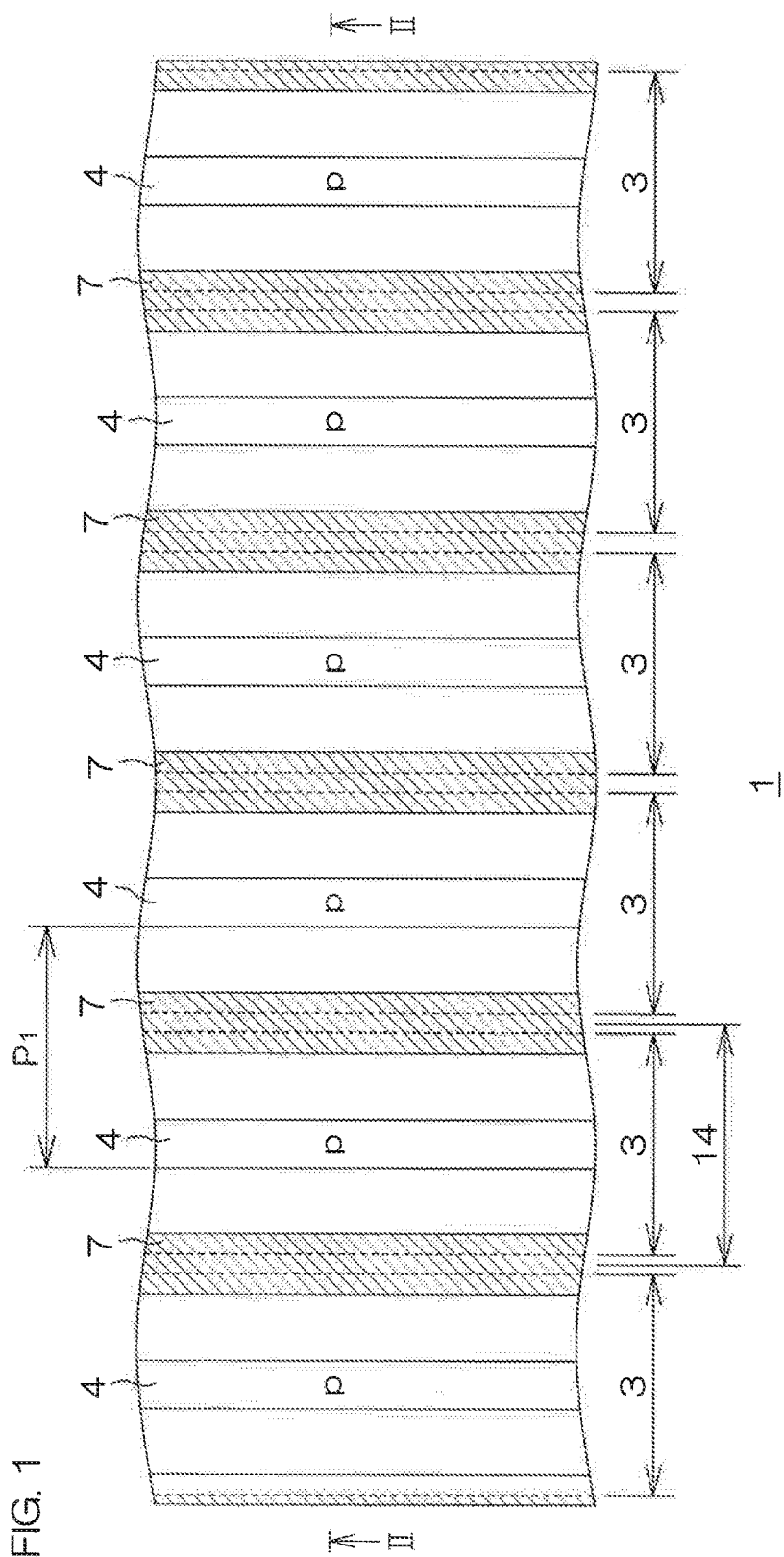
FIG. 1 is a schematic plan view of a semiconductor device according to a preferred embodiment of the present invention.

A semiconductor device according to a preferred embodiment of the present invention includes a semiconductor layer, having a drain region of a first conductivity type at a rear surface side, a body region of a second conductivity type, disposed at a front surface portion of the semiconductor layer, a source region of the first conductivity type, disposed at a front surface portion of the body region, a gate electrode, facing the body region, a gate insulating film, between the body region and the gate electrode, a first pillar layer of the second conductivity type, disposed inside the semiconductor layer so as to be continuous to the body region and extending from the body region toward the rear surface of the semiconductor layer, and a trap level region, disposed inside the semiconductor layer and containing charged particles that form a trap level, and an electric field concentration portion, where an electric field concentrates in an off state in which a channel is not formed in the body region, and the trap level region are disposed at mutually different depth positions in a depth direction of the first pillar layer.

With the present arrangement, when a parasitic diode between a source and a drain of the semiconductor device is turned off, carriers (electrons) that move inside the drain region become trapped in the trap level region inside the semiconductor layer, thereby enabling a carrier recombination time inside the device to be made fast and thus enabling a reverse recovery time trr to be shortened. Use can also be made of withstand voltage improvement, which is an inherent characteristic of a super junction structure.

Also, by the electric field concentration portion being disposed at a different depth position from the trap level region, an electric field applied to a vicinity of the trap level region can be relaxed comparatively.

In the semiconductor device according to the preferred embodiment of the present invention, the electric field concentration portion maybe disposed not less than 10 μm away from the trap level region in the depth direction of the first pillar layer.

For example, a literature value of a distribution spread of a defect generated by He irradiation is σ=20 μm approximately, and it is therefore preferable for the electric field concentration portion to be separated from the trap level region by not less than 10 μm, which is ½ the literature value.

In the semiconductor device according to the preferred embodiment of the present invention, the electric field concentration portion may be disposed at a position shallower than the trap level region in the depth direction of the first pillar layer.

In the semiconductor device according to the preferred embodiment of the present invention, the first pillar layer may be divided vertically by interposing, at an intermediate portion in its depth direction, a dividing region constituted of a portion of the semiconductor layer, and the electric field concentration portion may be disposed in the dividing region.

In the semiconductor device according to the preferred embodiment of the present invention, the first pillar layer may include a plurality of the first pillar layers aligned along the front surface of the semiconductor layer, a second pillar layer of the first conductivity type may be disposed, in the semiconductor layer, between the plurality of first pillar layers, and charge balance of the first pillar layers and the second pillar layer may be secured.

Here, in regard to the charge balance, there is a prerequisite for realizing high withstand voltage with the super junction structure that the first pillar layers and the second pillar layer are equal in charge (sheet concentration). If variation of impurity concentration occurs and the charges become unequal, that is, a charge unbalance occurs, an electric field distribution will no longer be flat and the withstand voltage will decrease. By securing the charge balance, the effect of shortening the reverse recovery time trr described above can be achieved while making use of withstand voltage improvement, which is an inherent characteristic of a super junction structure Such charge balance is secured, for example, by adjusting a concentration of an n type semiconductor during epitaxial growth and a concentration of a p type pillar layer. For example, an n type impurity concentration of the dividing region is adjusted to have a lower n type impurity concentration in comparison to other layers. The concentrations are thus adjusted so that when a drift layer (n type semiconductor layer) is completed depleted, that is, when a depletion layer extends to a lower end of the p type pillar layer, the charges inside the depletion layer are balanced.

In the semiconductor device according to the preferred embodiment of the present invention, each of the first pillar layers may have a width of 2 μm to 6 μm and an impurity concentration of $3 \times 10^{15}$ cm$^{-3}$ to $8 \times 10^{15}$ cm$^{-3}$, and the second pillar layer may have a width of 2 μm to 10 μm and an impurity concentration of $1 \times 10^{15}$ cm$^{-3}$ to $3 \times 10^{15}$ cm$^{-3}$.

In the semiconductor device according to the preferred embodiment of the present invention, the charged particles may include any of protons, deuterium, $^3$He$^{++}$, and $^4$He$^{++}$.

In the semiconductor device according to the preferred embodiment of the present invention, the first pillar layers may be formed in stripes.

The semiconductor device according to the preferred embodiment of the present invention may further include a collector region of the second conductivity type, disposed selectively at the rear surface of the semiconductor layer.

With the present arrangement, electrons or positive holes are implanted from the collector region into the drain region, and therefore conductivity modulation can be made to occur in the drain region. Consequently, in a high current range, a current can be increased along a current waveform depicted when an IGBT is put in operation. That is, a semiconductor device, having both characteristics of a MOSFET, which is excellent in set efficiency in a low current range, and characteristics of an IGBT, which is capable of making conductivity modulation occur at a high voltage range, can be provided.

In the semiconductor device according to the preferred embodiment of the present invention, the gate electrode may include a planar gate type gate electrode.

In the semiconductor device according to the preferred embodiment of the present invention, the gate electrode may include a trench gate type gate electrode.

Preferred embodiments of the present invention shall now be described in detail with reference to the attached drawings.

Figure 2:
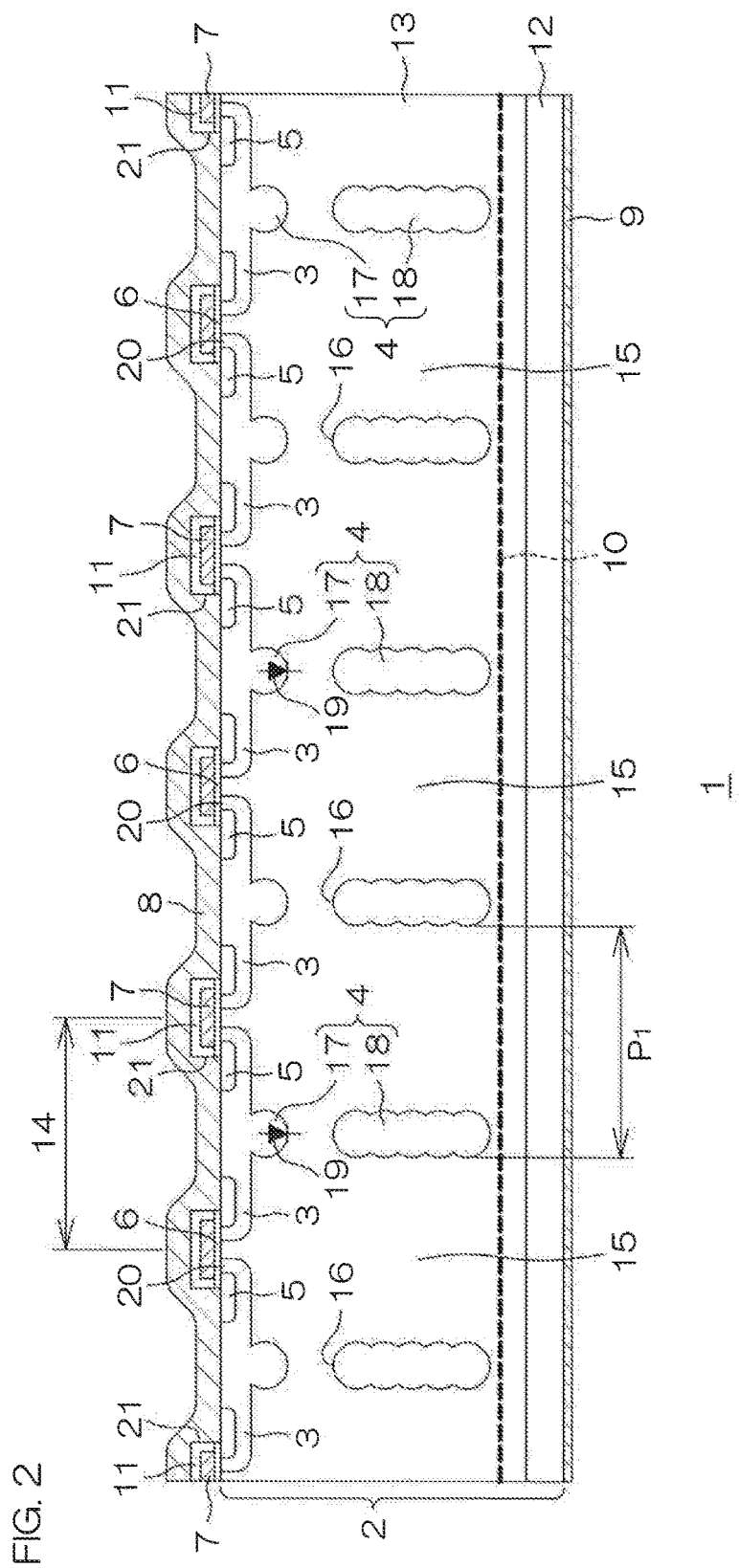
FIG. 2 is a sectional view taken along section plane II-II of FIG. 1.

FIG. 1 is a schematic plan view of a semiconductor device 1 according to a preferred embodiment of the present invention. FIG. 2 is a sectional view taken along section plane II-II of FIG. 1. In FIG. 1, only the arrangement necessary for description is shown and, for example, illustrations of an n$^+$ type source region 5, a source electrode 8, etc., are omitted.

The semiconductor device 1 is an n channel type MOSFET (Metal Oxide Semiconductor Field Effect Transistor) having a super junction structure.

The semiconductor device 1 includes an n type semiconductor layer 2, p type body regions 3, p type pillar layers 4, as an example of first pillar layers of the present invention, n$^+$ type source regions 5, a gate insulating film 6, a gate electrode 7, a source electrode 8, a drain electrode 9, and a trap level region 10. An interlayer insulating film 11 is disposed on the gate electrode 7.

The n type semiconductor layer 2 may include, for example, an n$^+$ type substrate 12, as an example of a drain region of the present invention, and an n$^-$ type epitaxial layer 13, formed by growing a semiconductor crystal on the n$^+$ type substrate 12.

In the present preferred embodiment, the n$^+$ type substrate 12 and the n$^-$ type epitaxial layer 13 are constituted of silicon (Si). In regard to the n$^+$ type substrate 12, a thickness thereof may be approximately 150 μm to 180 μm, and an n type impurity concentration thereof may be approximately $1 \times 10^{18}$ cm$^{-3}$ to $3 \times 10^{18}$ cm$^{-3}$. On the other hand, in regard to the n$^-$ type epitaxial layer 13, a thickness thereof may be approximately 50 μm to 90 μm, and an n type impurity concentration thereof may be approximately $1 \times 10^{15}$ cm$^{-3}$ to $2 \times 10^{15}$ cm$^{-3}$. As the n type impurity contained in the n$^+$ type substrate 12 and the n$^-$ type epitaxial layer 13, P (phosphorus), As (arsenic), Sb (antimony), etc., may be applied.

The p type body regions 3 and the p type pillar layers 4 are impurity regions implanted with a p type impurity. More specifically, these maybe impurity regions formed by ion implantation (implantation) of the p type impurity into the n$^-$ type epitaxial layer 13. As the p type impurity contained in the p type body regions 3 and the p type pillar layers 4, B (boron), Al (aluminum), Ga (gallium), etc., may be applied.

As shown in FIG. 1, in a plan view of viewing from a direction of a normal to a front surface of the n$^-$ type epitaxial layer 13 (hereinafter referred to simply as "plan view"), the p type body regions 3 are formed selectively in a front surface portion of the n$^-$ type epitaxial layer 13 in a plurality of periodically and discretely disposed regions. In the present preferred embodiment, the plurality of p type body regions 3 are formed in mutually parallel stripes. A region including an individual p type body region 3 and the n$^-$ type epitaxial layer 13 in a periphery thereof forms a cell 14. That is, in the layout of FIG. 1, the semiconductor device 1 has multiple (plurality of) cells 14 that are aligned in stripes in plan view.

The p type pillar layers 4 are formed in regions at inner sides of the p type body regions 3 of the respective cells 14. More specifically, in the present preferred embodiment, the p type pillar layers 4 are formed in stripes in regions at width direction centers of the p type body regions 3 in plan view. n$^-$ type pillar layers 15, each of which, as an example of a second pillar layer of the present invention, is constituted of a portion of the n⁻ type epitaxial layer 13 sandwiched by mutually adjacent p type pillar layers 4, are thereby disposed, along with the p type pillar layers 4, in the n⁻ type epitaxial layer 13.

More specifically, each p type pillar layer 4 may have a width of 2 μm to 6 μm and an impurity concentration of $3 \times 10^{15}$ cm⁻³ to $8 \times 10^{15}$ cm⁻³. Also, each n⁻ type pillar layer 15 may have a width of 2 μm to 10 μm and an impurity concentration of $1 \times 10^{15}$ cm⁻³ to $3 \times 10^{15}$ cm⁻³.

The p type pillar layers 4 are formed to be continuous to the p type body regions 3 and, in the n type epitaxial layer 13, extend to positions deeper than the p type body regions 3 toward the n⁺ type substrate 12. Each p type pillar layer 4 is thus aligned in continuity with the p type body region 3 adjacent thereto. A pitch $P_1$ of the p type pillar layers 4 is, for example, 5 μm to 20 μm. Here, with one pair of a p type pillar layer 4 and an n⁻ type pillar layer 15 being a repetition unit, the pitch $P_i$ is a length along the front surface of the n⁻ type epitaxial layer 13 of the repetition unit. In the present preferred embodiment, a p type pillar layer 4 is disposed at the width direction center of each p type body region 3 and therefore the pitch $P_1$ coincides with a pitch of the cells 14 (cell pitch).

Each p type pillar layer 4 may be divided vertically by interposing, at an intermediate portion in its depth direction, a dividing region 16, constituted of a portion of the n⁻ type epitaxial layer 13. The p type pillar layer 4 may include an upper pillar layer 17 and a lower pillar layer 18 that are separated by the dividing region 16.

Side surfaces of the respective pillar layers 17 and 18 along a depth direction of the n⁻ type epitaxial layer are arranged as concave/convex surfaces undulating periodically along this direction. Although the number of concavities/convexities is ordinarily substantially matched with the number of stages of n type semiconductor layers 23 and 24 (FIG. 3A) to be described below, fewer concavities/convexities than the number of stages are shown in FIG. 2 for the sake of clarity.

The upper pillar layer 17 constitutes an integral body with the corresponding p type body region 3 and forms, together with the p type body region 3, a parasitic diode 19 at an interface (pn junction surface) with the n⁻ type epitaxial layer 13. On the other hand, the lower pillar layer 18 is separated and electrically floated from the p type body region 3 by the dividing region 16.

In plan view, the n⁺ type source regions 5 are formed in inner regions of the p type body regions 3 of the respective cells 14. In these regions, the n⁺ type source regions 5 are formed selectively at front surface portions of the p type body regions 3. The n⁺ type source regions 5 may be formed by selective ion implantation of an n type impurity into the p type body regions 3. Examples of the n type impurity are as have been mentioned above. Each n⁺ type source region 5 is formed inside the corresponding p type body region 3 so as to be positioned inward by only a predetermined distance from a peripheral edge (interface of the p type body region 3 and the n⁻ type epitaxial layer 13) of the p type body region 3. A front surface portion of the p type body region 3 is thereby interposed between the n⁺ type source region 5 and the n⁻ type epitaxial layer 13 in a surface layer region of the n type semiconductor layer 2 that includes the n⁻ type epitaxial layer 13, the p type body region 3, etc., and the interposed front surface portion provides a channel region 20.

In the present preferred embodiment, the n⁺ type source regions 5 are formed in stripes in plan view and are formed at regions further to outer sides than the side surfaces of the p type pillar layers 4. The channel regions 20 have shapes of stripes in accordance with the shapes of the n⁺ type source regions 5.

The gate insulating film 6 may be constituted, for example, of a silicon oxide film, silicon nitride film, silicon oxynitride film, hafnium oxide film, alumina film, tantalum oxide film, etc. The gate insulating film 6 is formed to cover at least the front surfaces of the p type body regions 3 in the channel regions 20. In the present preferred embodiment, the gate insulating film 6 is formed to cover front surfaces of the channel regions 20, the n⁻ type epitaxial layer 13, and portions of the n⁺ type source regions 5. To be more succinct, the gate insulating film 6 is formed in a pattern having openings, each at a central region of the p type body region 3 and an inner edge region of the n⁺ type source region 5, continuous to the central region, of each cell 14.

The gate electrode 7 is formed to face the channel regions 20 via the gate insulating film 6. The gate electrode 7 may be constituted of polysilicon that has been made low in resistance by implanting an impurity. In the present preferred embodiment, the gate electrode 7 is formed to substantially the same pattern as the gate insulating film 6 and covers a front surface of the gate insulating film 6. That is, the gate electrode 7 is disposed above the front surfaces of the channel regions 20, the n⁻ type epitaxial layer 13, and portions of the n⁺ type source regions 5. To be more succinct, the gate electrode 7 is formed in a pattern having openings, each at the central region of the p type body region 3 and the inner edge region of the n⁺ type source region 5, continuous to the central region, of each cell 14. That is, the gate electrode 7 is formed to control the plurality of cells 14 in common. A planar gate structure is thereby constructed.

The interlayer insulating film 11 is constituted, for example, of an insulating material, such as a silicon oxide film, silicon nitride film, TEOS (tetraethoxysilane), etc. The interlayer insulating film 11 is formed in a pattern that covers the gate electrode 7 and has contact holes 21, each at the central region of the p type body region 3 and the inner edge region of the n⁺ type source region 5, continuous to the central region, of each cell 14.

The source electrode 8 is constituted of aluminum or other metal. The source electrode 8 is formed to cover a front surface of the interlayer insulating film 11 and be embedded in the contact holes 21 of the respective cells 14. The source electrode 8 is thereby put in ohmic contact with the n⁺ type source regions 5. The source electrode 8 is thus connected in parallel to the plurality of cells 14 and is arranged for flow of the total current flowing through the plurality of cells 14. Also, the source electrode 8 is put in ohmic contact with the p type body regions 3 of the respective cells 14 via the contact holes 21 and stabilizes the potential at the p type body regions 3.

The drain electrode 9 is constituted of aluminum or other metal. The drain electrode 9 is formed to contact a rear surface of the n⁺ type substrate 12. The drain electrode 9 is thus connected in parallel to the plurality of cells 14 and is arranged for flow of the total current flowing through the plurality of cells 14.

When a DC power supply is connected between the source electrode 8 and the drain electrode 9 with the drain electrode 9 at the high potential side and the source electrode 8 at the low potential side, a reverse bias is applied to the parasitic diodes 19. If in this state, a control voltage lower than a predetermined threshold voltage is applied to the gate electrode 7, a current path will not be formed between the drain and the source. That is, the semiconductor device 1 will be in an off state. On the other hand, when a control voltage not less than the threshold voltage is applied to the gate electrode 7, electrons are drawn to the front surfaces of the channel regions 20 and an inversion layer (channels) is formed. Intervals between the n⁺ type source regions 5 and the n⁻ type epitaxial layer 13 are thereby made electrically continuous. That is, current paths, leading from the source electrode 8 to the drain electrode 9 successively through the n⁺ type source regions 5, the inversion layer of the channel regions 20, and the n⁻ type epitaxial layer 13, are formed. That is, the semiconductor device 1 is put in an on state.

When the semiconductor device 1 is applied to an inverter circuit that drives an inductive load, such as an electric motor, etc., there may be a case where the source electrode 8 becomes higher in potential than the drain electrode 9 so that the parasitic diodes 19 turn on and a current flows through the parasitic diodes 19. When the source electrode 8 thereafter becomes lower in potential than the drain electrode 9, the parasitic diodes 19 are put in the reverse bias state and turn off. In the turned off state, a depletion layer spreads from the pn junction portions of the parasitic diodes 19, carriers (positive holes) inside the p type body region 3 and the p type pillar layers 4 move to the source electrode side, and carriers (electrons) inside the n⁻ type epitaxial layer 13 move to the drain electrode 9 side.

By the movements of the carriers, a current flows in the direction reverse that when the parasitic diodes 19 are in the on state. This current is called a reverse recovery current. The reverse recovery current increases once and thereafter decreases. A time from a point at which the forward current at the diodes becomes zero to a point at which the magnitude of the reverse recovery current decreases to 10% of its maximum value is called a reverse recovery time. When a variation (dir/dt) of the reverse recovery current is large, oscillation (ringing) may occur before the current converges to zero. Such a reverse recovery characteristic is called hard recovery and is a cause of noise and malfunction.

The trap level region 10 contributes to shortening of the reverse recovery time. The trap level region 10 is a region that is formed by irradiating charged particles from a rear surface side of the n type semiconductor layer 2. A large number of recombination centers, which trap, recombine, and thereby eliminate carriers, are present in the trap level region 10. Carriers can thereby be eliminated quickly when the parasitic diodes 19 turn off and therefore the reverse recovery time and the reverse recovery current can be reduced.

The trap level region 10 is formed locally inside the n⁻ type epitaxial layer 13 so as to spread thinly (for example, at a thickness of approximately 1 µm to 3 µm) at a depth position set in advance from a rear surface of the n⁻ type epitaxial layer 13.

Irradiation of charged particles, such as protons, deuterium, ³He⁺⁺, ⁴He⁺⁺, etc., may be applied to form the trap level region 10. Among these, helium atom nuclei (³He⁺⁺ or ⁴He⁺⁺), which are high in mass, are preferable in enabling a distribution range of the recombination centers to be made narrow in a thickness direction and thus enabling the recombination centers to be distributed locally within a narrow range in regard to the thickness direction.

Also, with the semiconductor device 1, each p type pillar layer 4 is divided vertically, with the lower pillar layer 18 being electrically floated with respect to the p type body region 3. The lower pillar layer 18 thus does not contribute to the operation of the parasitic diode 19 and therefore abrupt spreading of the depletion layer when the reverse recovery phenomenon occurs is suppressed. Spreading of the depletion layer toward the drain electrode 9 is thereby suppressed, and a rate at which the depletion layer spreads when the parasitic diode 19 turns off is suppressed. The variation rate (dir/dt) of the reverse recovery current is thereby made small and the recovery characteristics are improved.

Each of FIG. 3A to FIG. 3H is a diagram of a positional relationship of an electric field concentration portion and the trap level region 10 in the n type semiconductor layer 2.

The present inventor performed simulations by varying conditions regarding the positional relationship of the electric field concentration portion and the trap level region 10 in the n type semiconductor layer 2 in several patterns to test under which conditions the positions of the electric field concentration portion and the trap level 10 become separated or become near. That is, by performing simulations upon inputting the following conditions, etc., it can be determined which position the electric field concentration portion will be at when the semiconductor device is actually manufactured. The results are shown in FIG. 3A to FIG. 3H. In each of FIG. 3A to FIG. 3H, an electric field strength in the depth direction of the n type semiconductor layer 2 is shown in a graph at a side of the structure (principal portion) of the semiconductor device 1, and the symbol 25 indicates the electric field concentration portion at which the electric field strength is concentrated. The conditions of the respective diagrams of FIG. 3A to FIG. 3H are as follows.

Figure 3A:
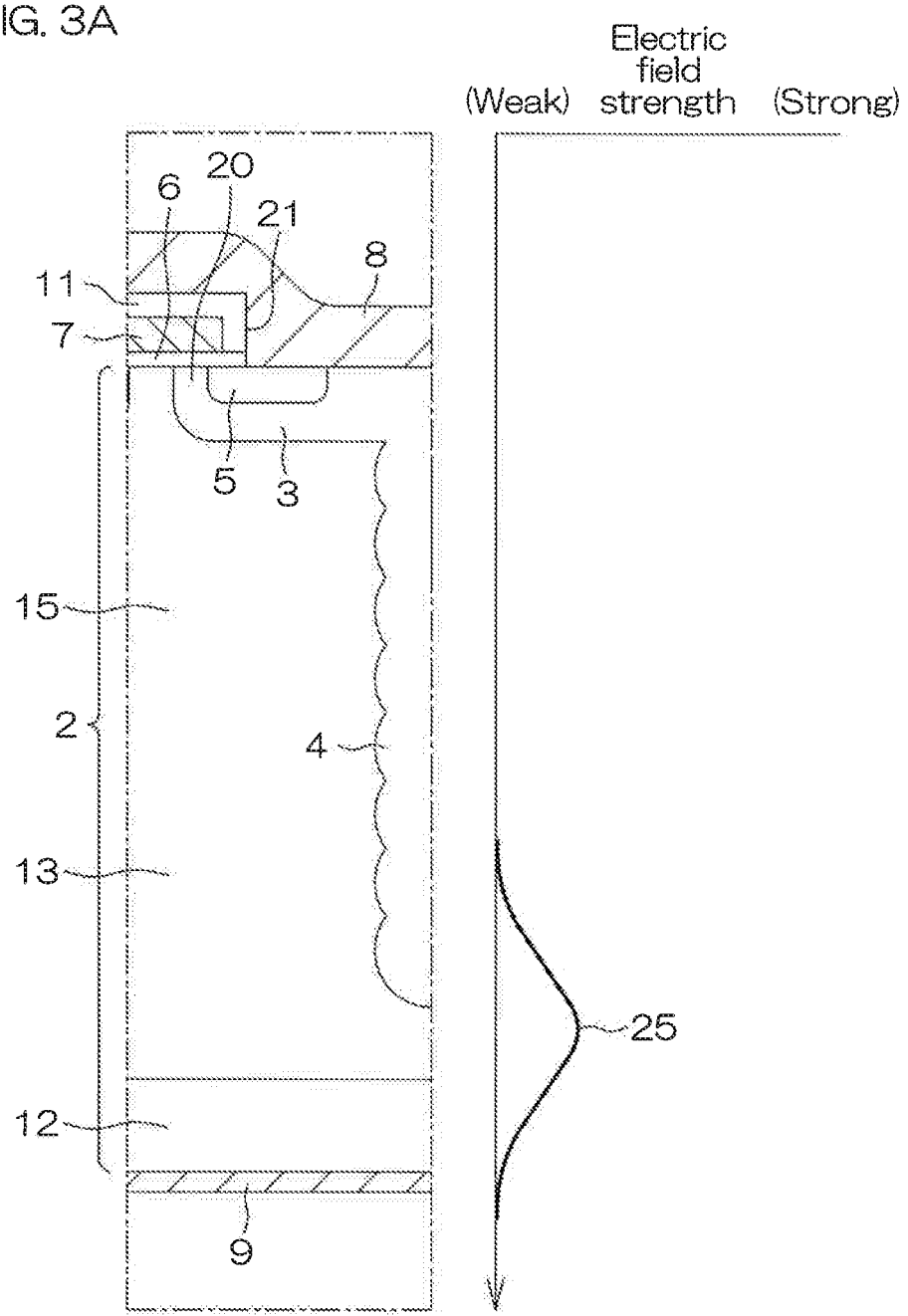
Figure 3E:
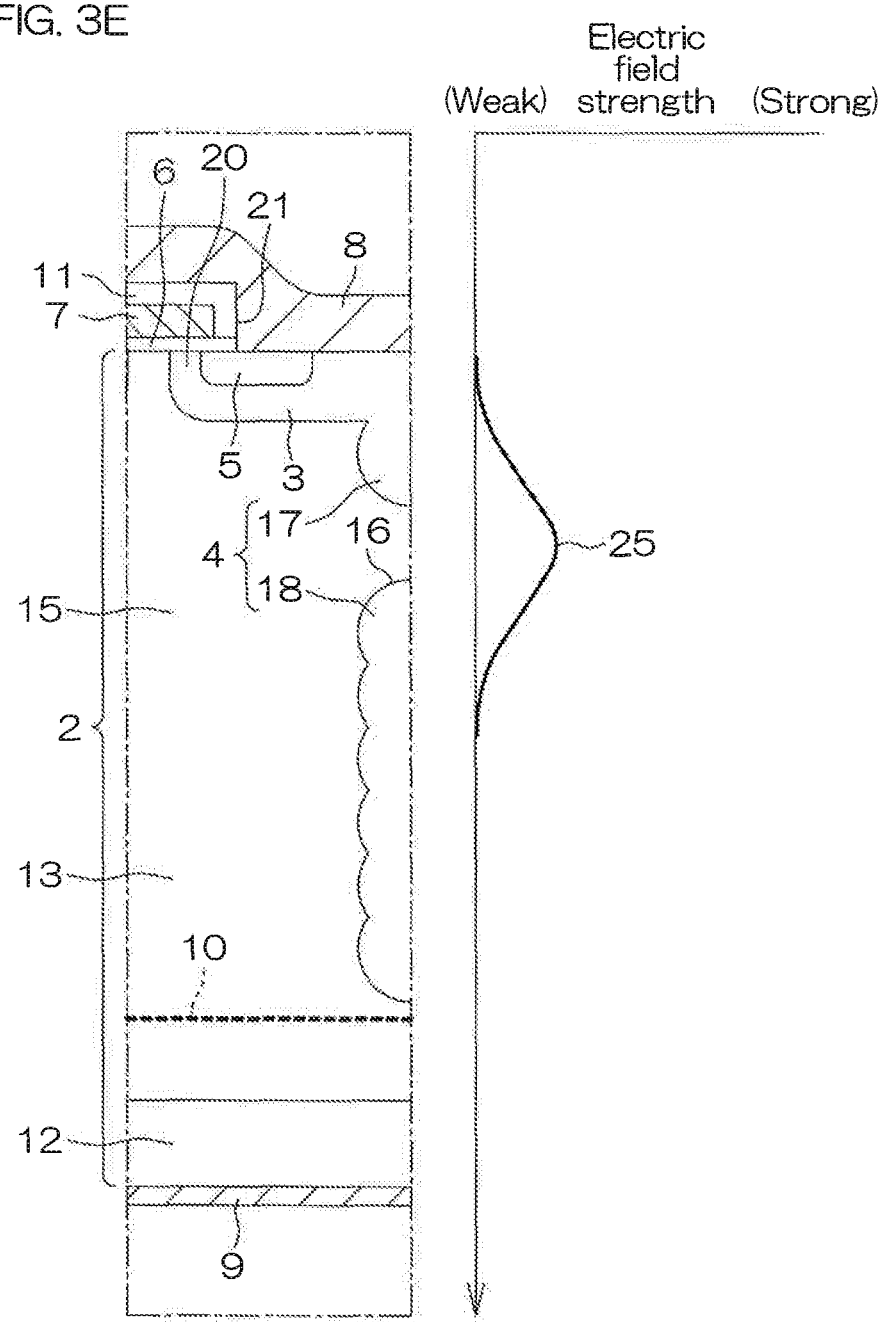
Figure 3H:
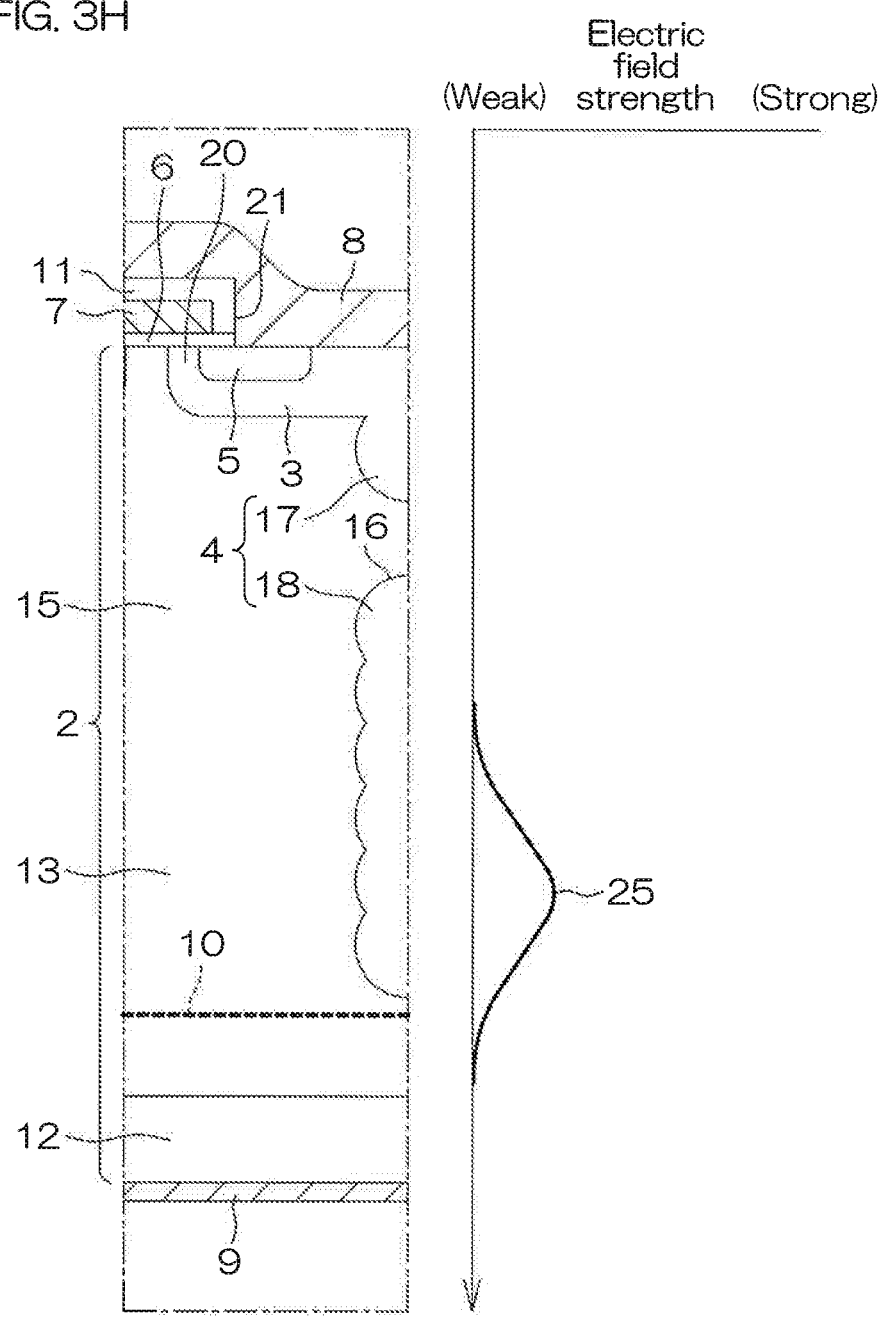
Figure 5A:
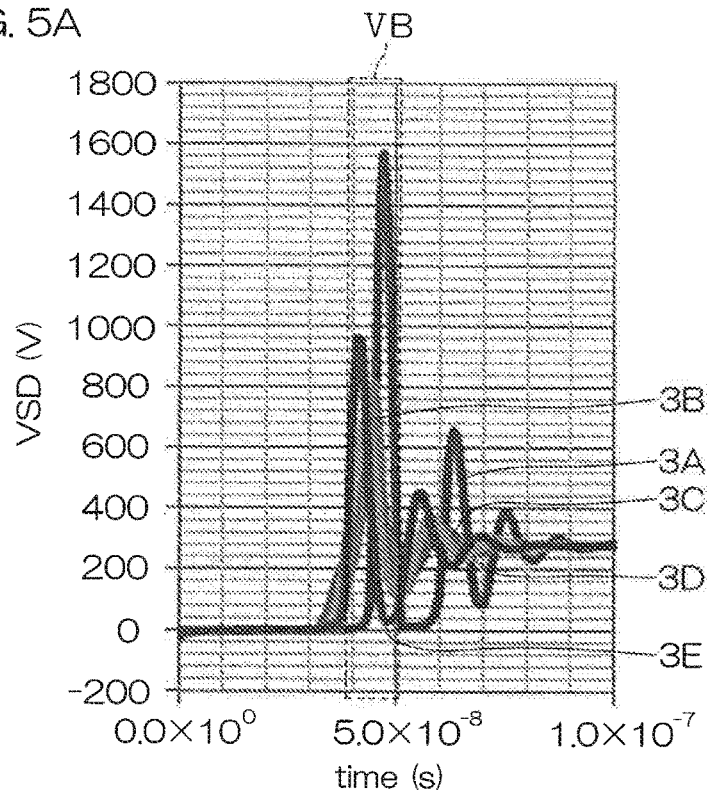
FIG. 5A shows waveforms of voltage reverse recovery characteristics under the conditions of FIG. 3A to FIG. 3E.
Figure 5B:
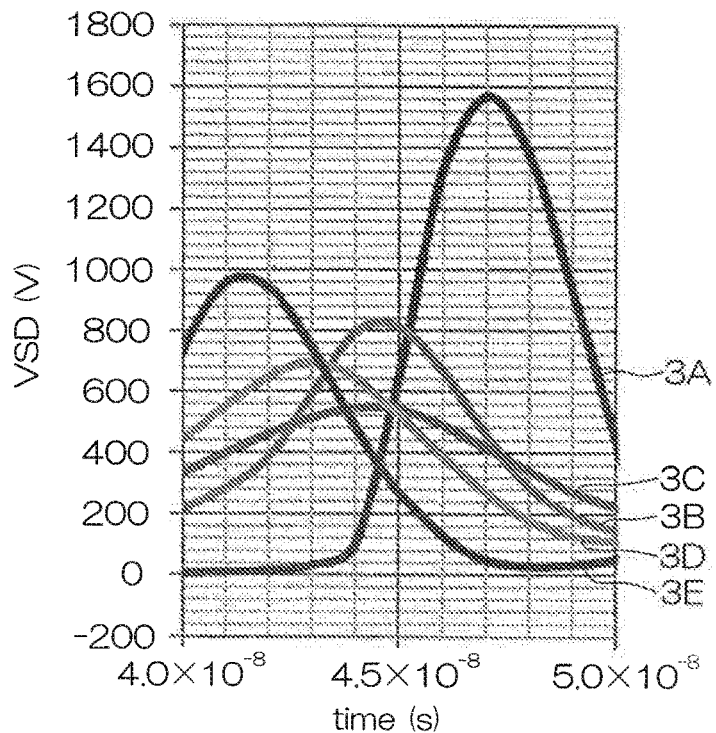
FIG. 5B is an enlarged view of a region surrounded by broken lines VB in FIG. 5A.

FIG. 3A: No pillar division
FIG. 3B: No pillar division
FIG. 3C: No pillar division
FIG. 3D: Pillar is divided (at the third stage from the bottom).
FIG. 3E: Pillar is divided (at the seventh stage from the bottom).
FIG. 3F: Pillar is divided (at the third stage from the bottom).
FIG. 3G: Pillar is divided (at the seventh stage from the bottom).
FIG. 3H: Pillar is divided (at the seventh stage from the bottom).

As shown by the results of FIG. 3A to FIG. 3H, it was possible in the cases of FIG. 3C, FIG. 3D, FIG. 3E, FIG. 3G, and FIG. 3H to position the electric field concentration portion 25 and the trap level region 10 in the n type semiconductor layer 2 at mutually different depth positions by varying the conditions. For example, in FIG. 3D and FIG. 3E, whereas the trap level region 10 is disposed at a vicinity of a bottom portion of the p type pillar layer 4, the electric field concentration portion 25 is disposed at the depth position of the division region 16 of the p type pillar 4 in each case. Also in FIG. 3G and FIG. 3H, although the electric field concentration portion 25 is not at the depth position of the division region 16, it is disposed at a position shallower than the trap level region 10 and it is thereby made possible to separate the electric field concentration portion 25 and the trap level region 10.

Further, reverse recovery characteristics were tested for the cases of FIG. 3A to FIG. 3E, among FIG. 3A to FIG. 3H. The results are shown in FIG. 4A, FIG. 4B, FIG. 5A, and FIG. 5B. From these figures, it was found that in all of the cases of FIG. 3C, FIG. 3D, and FIG. 3E, for which an effect of relaxing the concentration of electric field was anticipated, the reverse recovery time trr (the trr of only 3E is shown in FIG. 4A) is shortened and improvements of other reverse recovery characteristics (reduction of reverse recovery current, reduction of reverse recovery voltage, reduction of ringing of reverse recovery current, etc.) are achieved in comparison to the structure of FIG. 3A in which the trap level region 10 is not formed. That is, it was found that at least with the arrangements of FIG. 3C, FIG. 3D, and FIG. 3E, the reverse recovery characteristics of the semiconductor device 1 with the super junction structure can be improved.

A method for manufacturing the semiconductor device 1 shall now be described.

FIG. 6A to FIG. 6D are diagrams showing the method for manufacturing the semiconductor device 1 in the order of process.

To manufacture the semiconductor device 1, an n type initial base layer 22 is formed on the n+type substrate 12 as shown for example in FIG. 6A. Conditions of epitaxial growth are, for example, 1 Ω·cm to 10 Ω·cm and a thickness of 5 μm to 20 μm.

Figure 6B:
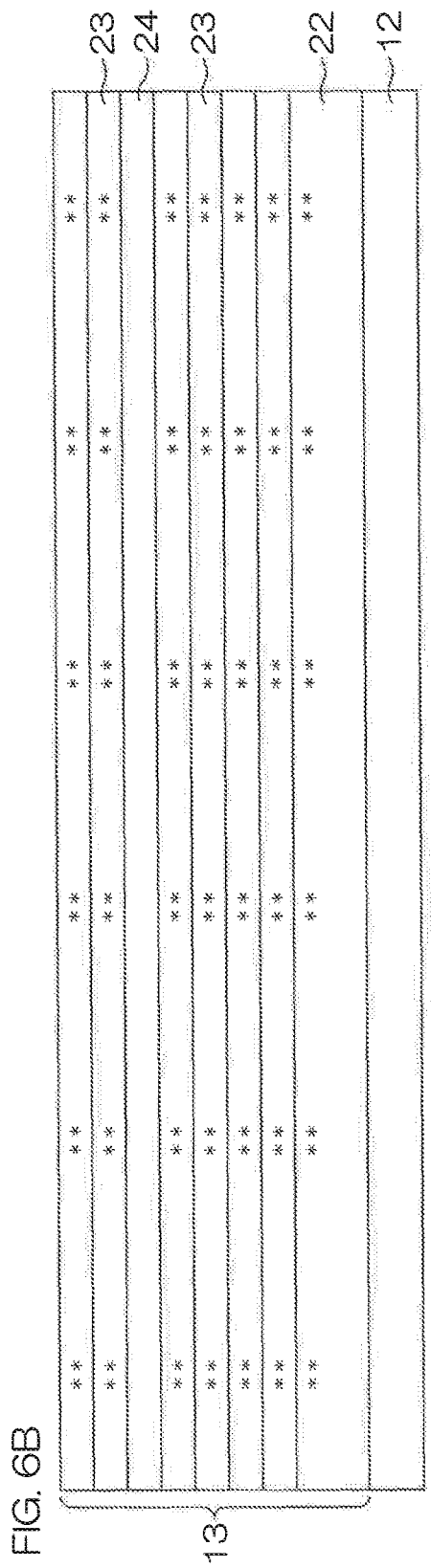

Next, as shown in FIG. 6B, a plurality of layers of the n type semiconductor layer 23 are laminated on the initial layer 22 by multi-epitaxial growth, in which a process of forming the thin n type semiconductor layer 23 of 1 Ω·cm to 10 Ω·cm/2 μm to 10 μm is repeated while selectively implanting a p type impurity (implanting B ions at 50 keV, $5.3 \times 10^{13}$ cm$^{-2}$, and 0 degrees) at positions at which the p type pillar layers 4 are to be formed. Thereafter, one stage of the n type semiconductor layer 24, with the same resistance and thickness (1 Ω·cm to 10 Ω·cm/2 μm to 10 μm) as each n type semiconductor layer 23, is grown without implanting the p type impurity. Multi-epitaxial growth of the n type semiconductor layers 23 is then performed again. The plurality of layers of the n type semiconductor layers 23 and 24 and the initial base layer 22 are thereby made integral to form the n⁻ type epitaxial layer 13.

Figure 6C:
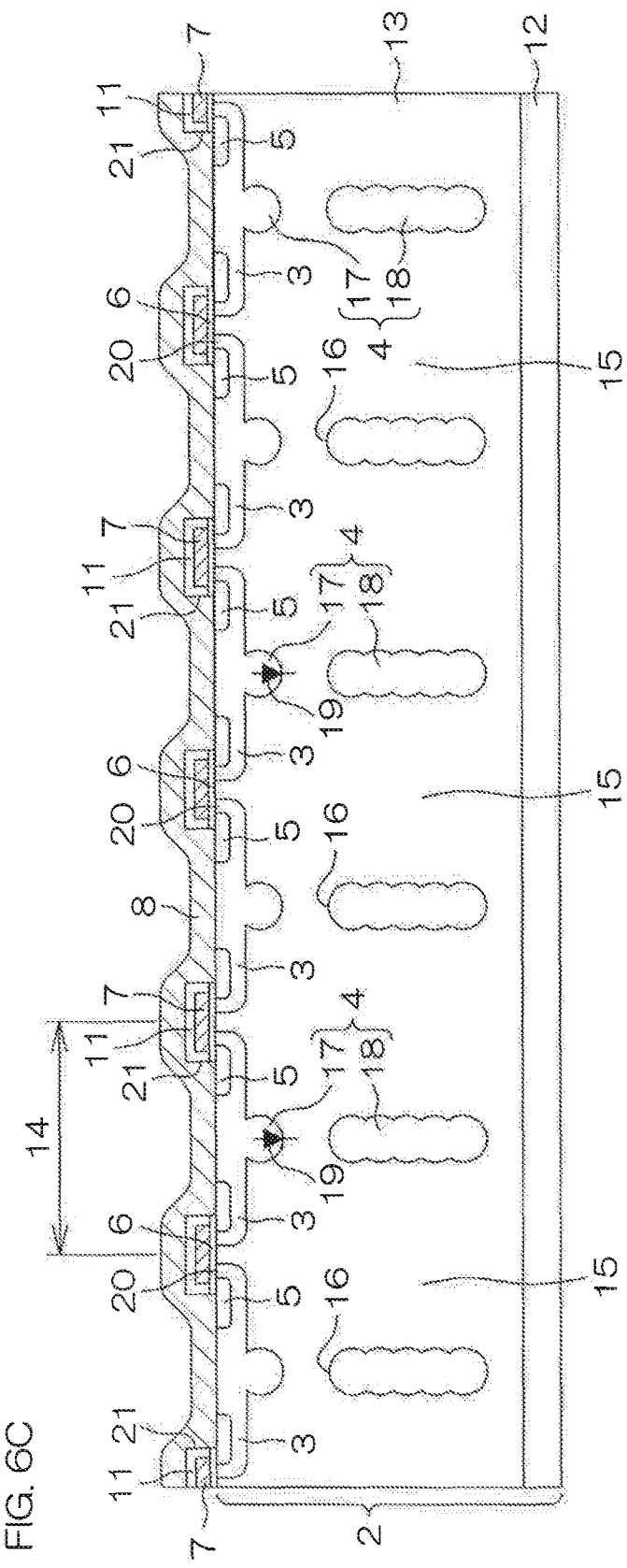

Next, as shown in FIG. 6C, an annealing processing (1000° C. to 1200° C.) is performed to perform drive diffusion of the p type impurity in the plurality of layers of n type semiconductor layers 23 and 24. The p type pillar layers 4 that are divided at intermediate portions are thereby formed. That is, the lower pillar layers 18 are provided by the diffusion of the p type impurity inside the n type semiconductor layers 23 at a lower side than the n type semiconductor layer 24, the upper pillar layers 17 are provided by the diffusion of the p type impurity inside the n type semiconductor layers 23 at a higher side than the n type semiconductor layer 24, and between these, the dividing region 16 is provided at the position of the n type semiconductor layer 24.

Next, the p type impurity is selectively implanted at a comparatively low energy (B ions are implanted at 50 keV, $5.0 \times 10^{15}$ cm$^{-2}$, and 7 degrees) into front surface portions of the n⁻ type epitaxial layer 13 to form the p type body regions 3. Also, in each p type body region 3, an n type impurity is selectively implanted (P ions are implanted at 130 keV, $2.0 \times 10^{15}$ cm$^{-2}$, and 7 degrees) in an annular region of predetermined width having an outer peripheral edge portion at a position receded inward by only a predetermined distance from an outer peripheral edge of the p type body region 3 in plan view, and the n⁺ type source regions 5 are thereby formed.

Next, the gate insulating film 6 is formed to cover the front surfaces of the n⁻ type epitaxial layer 13 and the p type body regions 3 (front surface of the semiconductor crystal). The gate insulating film 6 may be formed by thermal oxidation of the semiconductor crystal front surface. Further, the gate electrode 7 is formed on the gate insulating film 6. The forming of the gate electrode 7 may be performed, for example, by forming a polysilicon film, which has been lowered in resistance by adding an impurity, across the entire front surface and thereafter etching the polysilicon film selectively by photolithography. In the etching, the gate insulating film 6 may be patterned at the same time to form the gate electrode 7 and the gate insulating film 6 in the same pattern. Further, the interlayer insulating film 11 (for example, of 10000 Å thickness) is formed to cover the gate electrode 7, and the contact holes 21 are formed in the interlayer insulating film 11 by photolithography. Next, the source electrode 8 is formed on the interlayer insulating film 11, and heat treatment for ohmic junction formation by alloying is performed as necessary. Thereafter, an unillustrated front surface protection film (for example, of 16000 Å thickness) is formed and a pad opening, exposing a portion of the source electrode 8 as a pad, is formed in the front surface protection film.

Next, as shown in FIG. 6D, charged particle irradiation is performed from the rear surface of the n type semiconductor layer 2. As the charged particles irradiated in this process, for example, protons, deuterium, $^3$He$^{++}$, or $^4$He$^{++}$ are used. Thereafter, heat treatment at a low temperature (low temperature annealing) is performed. The irradiated charged particles are thereby activated. If helium atom nuclei ($^3$He$^{++}$ or $^4$He$^{++}$) are selected as the charged particles, these can be activated, for example, by heat treating at 320° C. to 380° C. (for example, at 350° C.) for approximately 30 minutes to 120 minutes (for example, for 60 minutes).

The trap level region 10 is thus formed. If the energy during irradiation of the charged particles is made high, the range of the charged particles will be long, so that the trap level region 10 will be formed at a position far from the rear surface of the n type semiconductor layer 2, and if the energy is made low, the range of the charged particles will be short, so that the trap level region 10 will be formed at a position near to the rear surface of then type semiconductor layer 2. The irradiation energy of the charged particles is thus set in accordance with the positioning of the trap level region 10.

Thereafter, the drain electrode 9 is formed on the rear surface of the n⁺ type substrate 12, and heat treatment for ohmic junction formation by alloying is performed as necessary.

The semiconductor device 1 of FIG. 1 and FIG. 2 can be obtained through the above processes.

Figure 8:
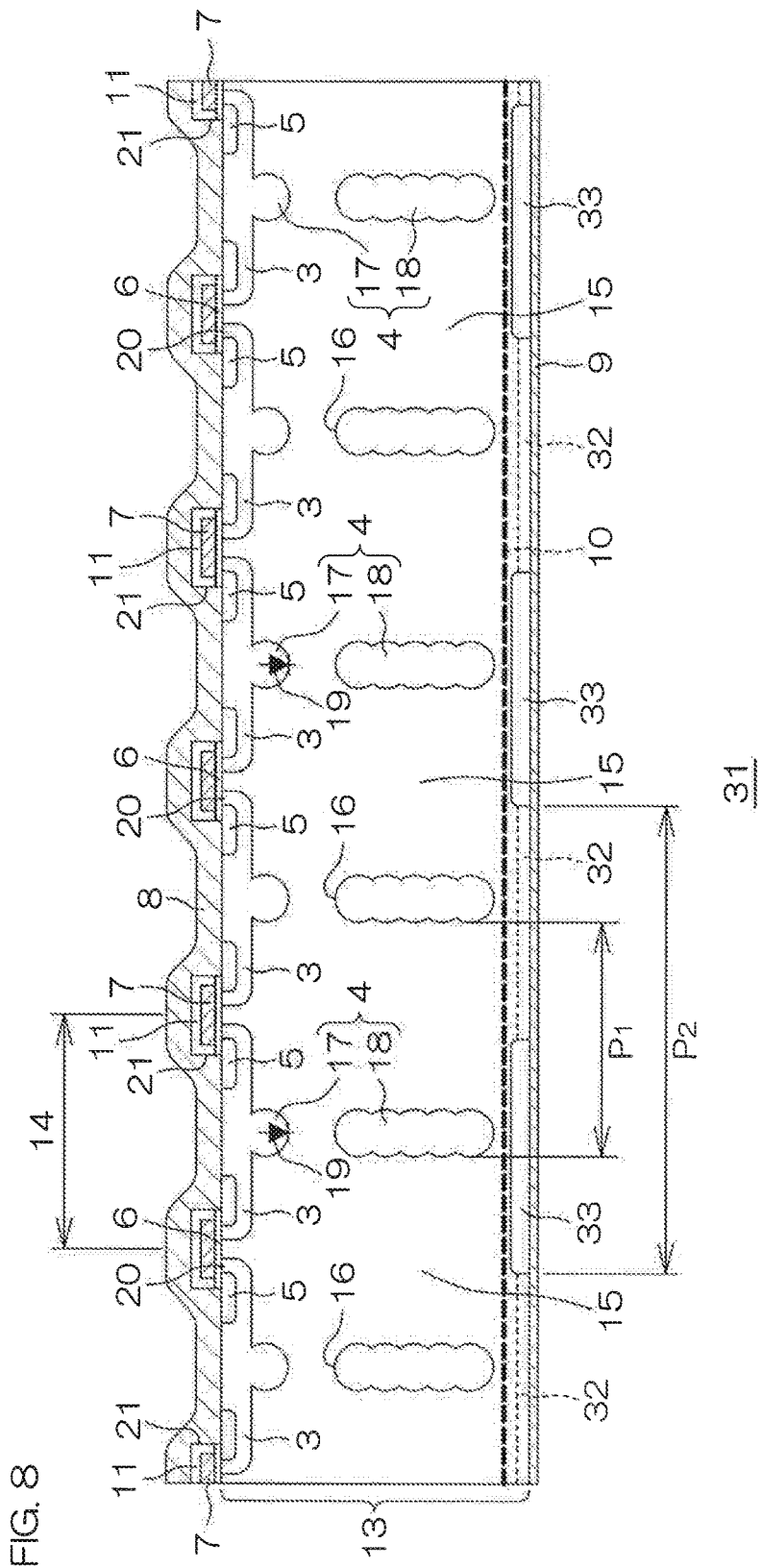
FIG. 8 is a sectional view taken along section plane VIII-VIII of FIG. 7.

FIG. 7 is a schematic plan view of a semiconductor device 31 according to another preferred embodiment of the present invention. FIG. 8 is a sectional view taken along section plane VIII-VIII of FIG. 7. In FIG. 7 and FIG. 8, portions corresponding to respective portions indicated in FIG. 1 and FIG. 2 described above are provided with the same reference symbols and description thereof shall be omitted.

The semiconductor device 31 differs from the semiconductor device 1 described above in the point that the n⁺ type substrate 12 is omitted. More specifically, the semiconductor device 31 has, in place of the n⁺ type substrate 12, an n⁺ type contact region 32, which, as an example of the drain region of the present invention, serves as a layer for providing contact with the drain electrode 9.

The n⁺ type contact region 32 is formed across the entire rear surface of the n⁻ type epitaxial layer 13. The n⁺ type contact region 32 is formed at a depth such that an interval is formed with respect to the bottom portions of the p type pillar layers 4. The n⁻ type epitaxial layer 13 is thereby interposed between the p type pillar layers 4 and the n⁺ type contact region 32.

The semiconductor device 31 also differs from the semiconductor device 1 described above in the point of having p⁺ type collector regions 33 selectively at a rear surface portion of the n⁺ type contact region 32.

The p+ type collector regions 33 are formed selectively in the rear surface of the n− type epitaxial layer 13 and a plurality thereof are aligned with continuity along the rear surface. In the present preferred embodiment, the p+ type collector regions 33 are formed in stripes parallel to the p type pillar layers 4 in plan view as indicated clearly by cross-hatching in FIG. 7. The p+ type collector regions 33 and portions of the n+ type contact region 32 between mutually adjacent p+ type collector regions 33 are thereby exposed alternately in stripes at the rear surface of the n− type epitaxial layer 13.

A pitch $P_2$ of the p+ type collector regions 33 may be greater than the pitch $P_1$ of the p type pillar layers 4. The semiconductor device 31 is thereby made to selectively have p type pillar layers 4 that face a p+ type collector region 33 in the thickness direction of the n− type epitaxial layer 13 and p type pillar layers 4 that do not face a p+ type collector region 33 but face an n type portion between mutually adjacent p+ type collector regions 33.

To further describe the arrangement of the p+ type collector regions 33, an impurity concentration of the p+ type collector regions 33 is $1\times10^{17}$ cm$^{-3}$ to $1\times10^{22}$ cm$^{-3}$. Also, the p+ type collector regions 33 are formed to reach the n− type epitaxial layer 13 upon penetrating through the n+ type contact region 32 in the thickness direction from the rear surface of the n− type epitaxial layer 13 and have a depth of 0.2 μm to 3 μm from the rear surface of the n− type epitaxial layer 13. Also, a width of each p+ type collector region 33 is 5 μm to 200 μm.

With the semiconductor device 31, the plurality of p+ type collector regions 33 are selectively formed on the rear surface of the n− type epitaxial layer 13 and therefore both the n− type epitaxial layer 13 and the p+ type collector regions 33 are exposed at the rear surface. Thus by forming the drain electrode 9 on the rear surface of the n− type epitaxial layer 13 so as to contact both of the exposed n− type epitaxial layer 13 and p+ type collector regions 33, the semiconductor device 31, having both the characteristics of a MOSFET, which is excellent in set efficiency in a low current range, and the characteristics of an IGBT, which is capable of making conductivity modulation occur at a high voltage range, can be provided. Obviously, the same actions and effects as those of the semiconductor device 1 described above can also be realized.

FIG. 9A to FIG. 9H are diagrams showing portions of a process for manufacturing the semiconductor device 31 in the order of process. In FIG. 9A to FIG. 9H, portions corresponding to respective portions indicated in FIG. 6A to FIG. 6D described above are provided with the same reference symbols and description thereof shall be omitted.

Figure 9A:
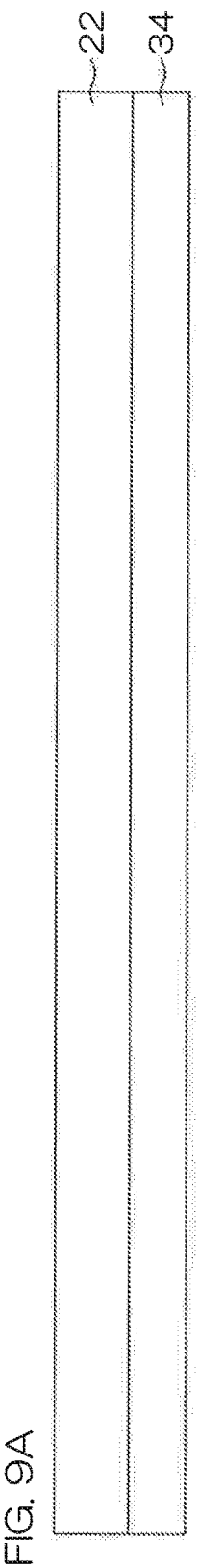

To manufacture the semiconductor device 31, the initial base layer 22 is formed on a substrate 34 by performing epitaxial growth while implanting an n type impurity as shown for example in FIG. 9A. Although an n type silicon substrate may be adopted as the substrate 34, the substrate 34 is eliminated in a later process and therefore is not required to be of high quality and an inexpensive substrate maybe used.

Next, as shown in FIG. 9B, a plurality of layers of the n type semiconductor layer 23, a single layer of the n type semiconductor layer 24, and a plurality of the n type semiconductor layers 23 are epitaxially grown successively on the initial layer 22.

Figure 9C:
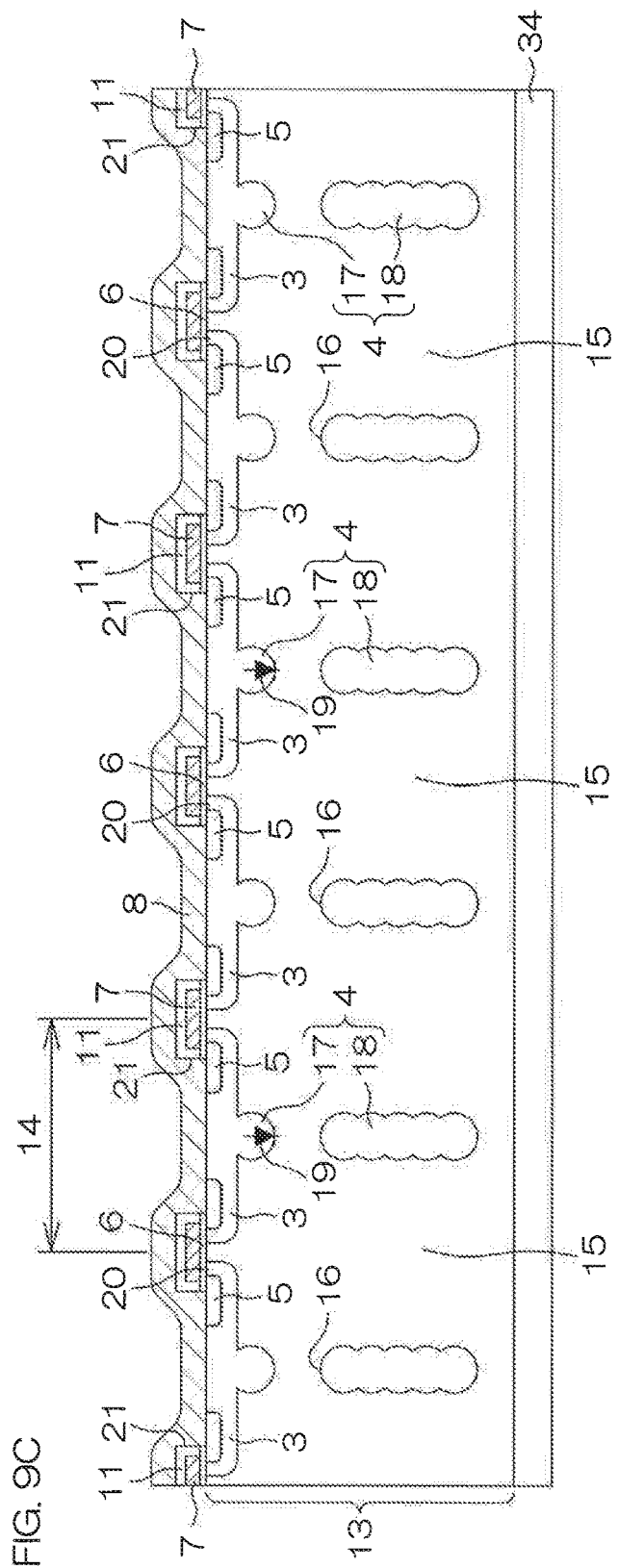

Next, as shown in FIG. 9C, an annealing processing (1000° C. to 1200° C.) is performed to perform drive diffusion of the p type impurity in the plurality of layers of n type semiconductor layers 23 and 24. The p type pillar layers 4 that are divided at intermediate portions are thereby formed. Next, the p type body regions 3, the n+ type source regions 5, the gate insulating film 6, the gate electrode 7, the interlayer insulating film 11, and the source electrode 8 are formed by the same method as described above.

Next, as shown in FIG. 9D, the substrate 34 is ground from a rear surface side using, for example, a grinder. The grinding may be performed, for example, so that the n− type epitaxial layer 13 directly under the p type pillar layers 4 remains at a fixed thickness after the substrate 34 has been removed completely and the rear surface of the n− type epitaxial layer 13 is exposed. After the grinding, the rear surface of the n− type epitaxial layer 13 is finished to a mirror surface by spin etching of the rear surface.

As described above, the n− type epitaxial layer 13 is supported by the substrate 34 up to an intermediate stage of the manufacturing process and therefore transfer and handling of the n− type epitaxial layer 13 can be performed easily. Also, the grinding of the n− type epitaxial layer 13 can be executed continuously after the grinding of the substrate 34 and therefore the thickness of the n− type epitaxial layer 13 directly under the p type pillar layers 4 can be adjusted easily.

Figure 9E:
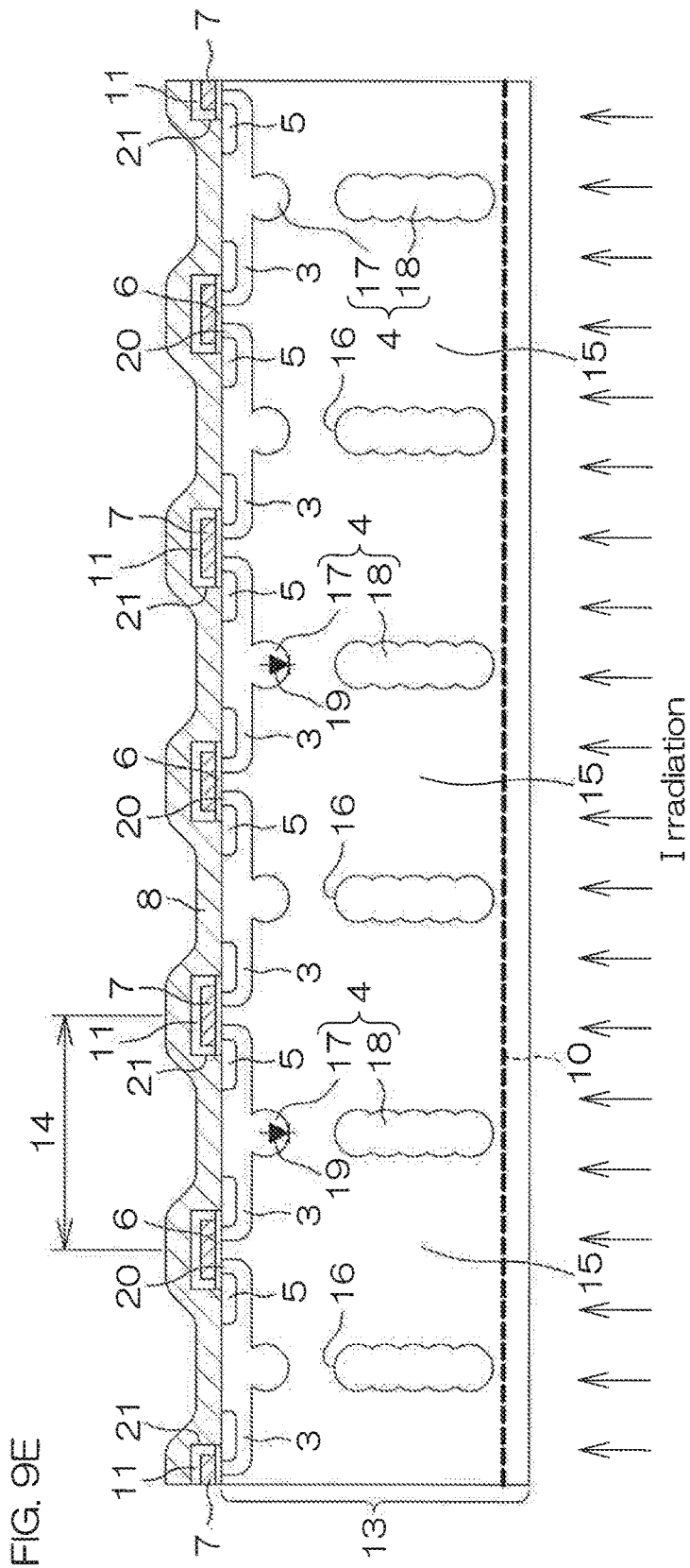

Next, as shown in FIG. 9E, charged particle irradiation is performed from the rear surface of the n− type epitaxial layer 13. Thereafter, heat treatment at a low temperature (low temperature annealing) is performed. The irradiated charged particles are thereby activated. The trap level region 10 is thus formed.

Figure 9F:
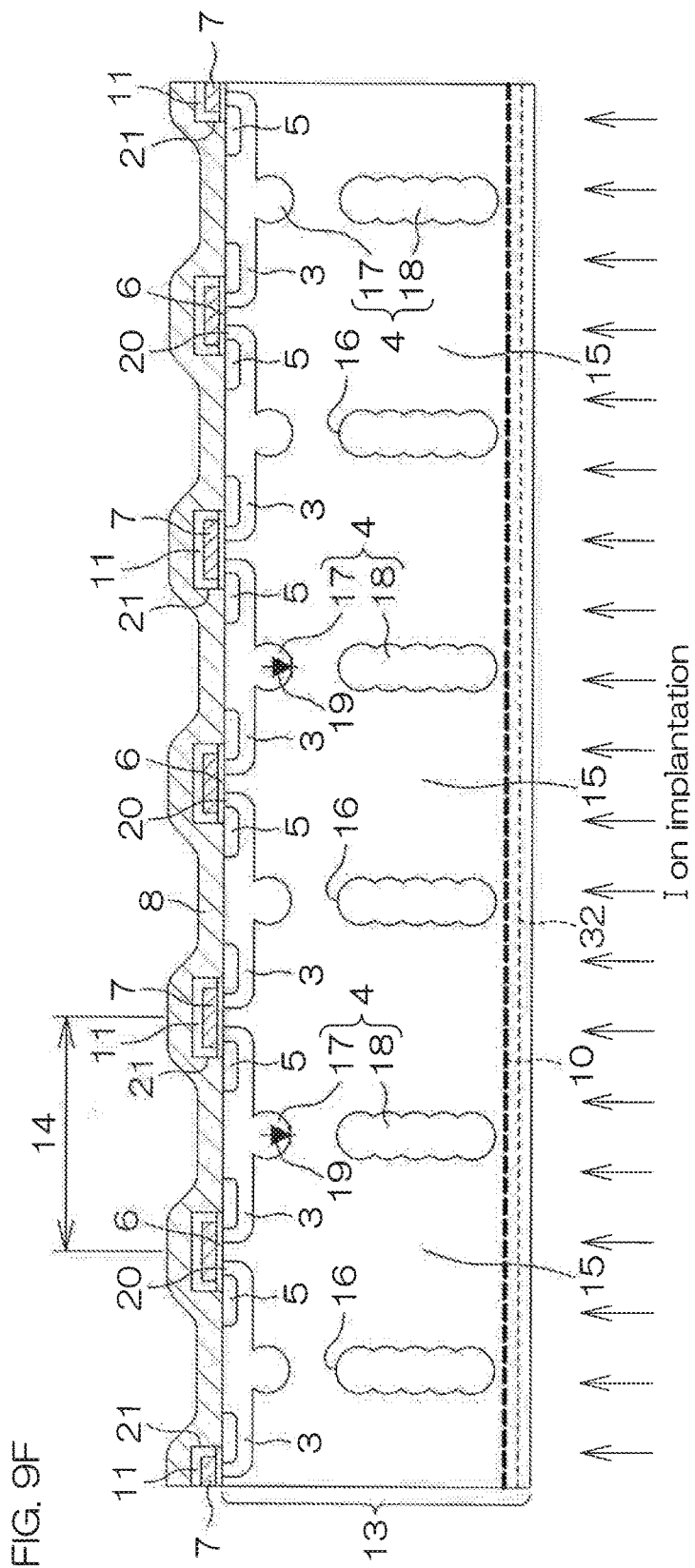

Next, as shown in FIG. 9F, implantation of an n type impurity (implantation of As ions at 30 keV, $1.0\times10^{15}$ cm$^{-2}$, and 0 degrees) into the rear surface of the n− type epitaxial layer 13 is performed across the entire surface and annealing processing is performed to form the n+ type contact region 32.

Figure 9G:
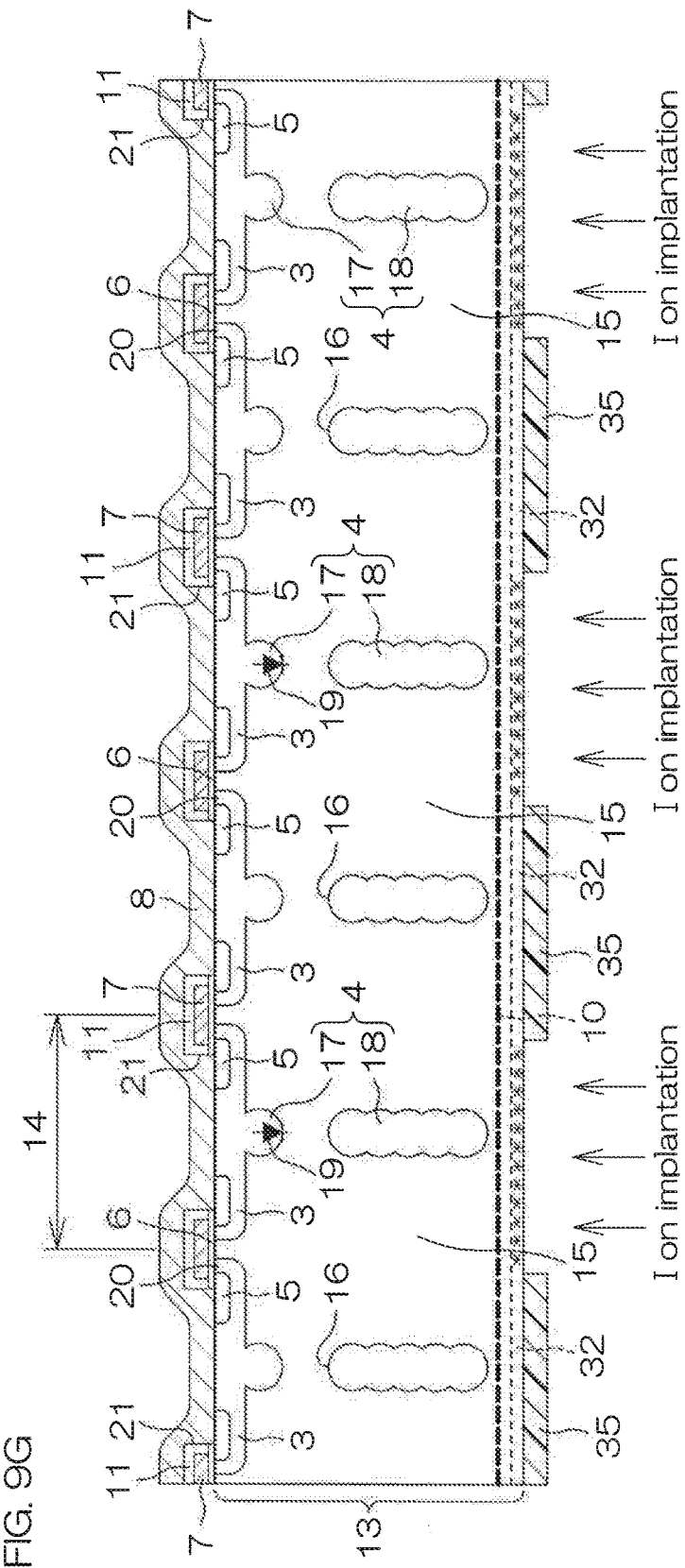

Next, a photoresist 35, which selectively exposes the rear surface of the n− type epitaxial layer 13, is formed as shown in FIG. 9G. Then via the photoresist 35, B ions are implanted first at 100 keV, $1.0\times10^{15}$ cm$^{-2}$, and an inclination angle of 7 degrees. In continuation, BF$_2$ ions are implanted at a lower energy than in the process of implanting the B ions, that is, specifically at 30 keV, $1.0\times10^{15}$ cm$^{-2}$, and 7 degrees (same inclination angle). In this process, by implanting the B ions and BF$_2$ ions not perpendicularly with respect to the rear surface of the n− type epitaxial layer 13 but obliquely at a predetermined inclination angle, channeling, with which the ions enter deeply into the n− type epitaxial layer 13, can be prevented. The photoresist 35 is thereafter removed, for example, by ashing.

Next, as shown in FIG. 9H, the n type epitaxial layer 13 is subject to laser annealing processing to activate the B ions and the BF$_2$ ions implanted in the previous process. The conductivity type of portions of the n+ type contact region 32 is thereby inverted from the n type to the p type so that the p+ type collector regions 33 are formed.

Melting of the source electrode 8 in this process can be prevented because an annealing processing of high temperature (for example, of approximately 1500° C.) is not executed. That is, metal-based portions, such as the source electrode 8, etc., that melt readily under a high temperature environment can be prepared ahead of the annealing processing. A large portion or all of the structure at the front surface side of the n− type epitaxial layer 13 can thus be prepared before performing the annealing processing. Consequently, the front and rear surfaces of the n− type epitaxial layer 13 do not have to be inverted a number of times and improvement of manufacturing efficiency can thus be achieved.

Thereafter, the drain electrode 9 is formed on the rear surface of the n⁻ type epitaxial layer 13, and heat treatment for ohmic junction formation by alloying is performed as necessary.

The semiconductor device 31 of FIG. 7 and FIG. 8 can be obtained through the above processes.

Although preferred embodiments of the present invention have been described above, the present invention may also be implemented in yet other modes.

Figure 10:
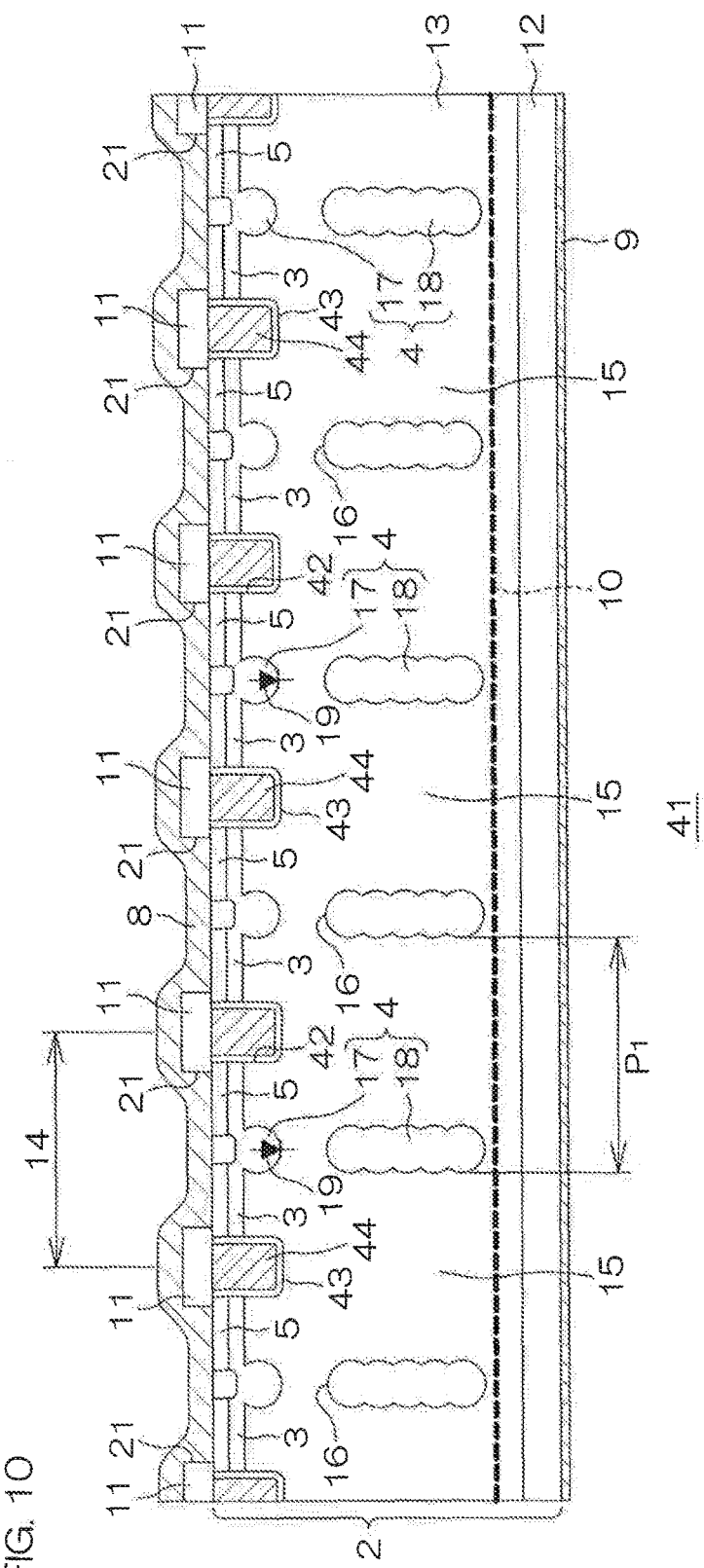
FIG. 10 is a schematic sectional view of a semiconductor device according to another preferred embodiment of the present invention.

For example, a trench gate structure may be provided as in a semiconductor device 41 shown in FIG. 10. Specifically, a trench gate structure may be provided where gate trenches 42, penetrating through the n⁺ type source regions 5 and the p type body regions 3 from the front surface of the n type semiconductor layer 2, are formed and gate electrodes 44 fill the gate trenches 42 via gate insulating films 43.

Also an arrangement in which the conductivity types of the respective semiconductor portions of any of the semiconductor devices 1, 31, and 41 are inverted may be adopted. For example, in the semiconductor device 1, a p type portion may be of an n type and an n type portion may be of a p type.

Besides the above, various design modifications may be made within the scope of the matters described in the claims.

What is claimed is:

1. A semiconductor device comprising:
a semiconductor layer, having a drain region of a first conductivity type at a rear surface side;
a body region of a second conductivity type, disposed at a front surface portion of the semiconductor layer;
a source region of the first conductivity type, disposed at a front surface portion of the body region;
a gate electrode, facing the body region;
a gate insulating film, between the body region and the gate electrode;
a first pillar layer of the second conductivity type, disposed inside the semiconductor layer so as to be continuous to the body region and extending from the body region toward the rear surface of the semiconductor layer; and
a trap level region, disposed inside the semiconductor layer and containing charged particles that form a trap level; and
wherein an electric field concentration portion, where an electric field concentrates in an off state in which a channel is not formed in the body region, and the trap level region are disposed at mutually different depth positions in a depth direction of the first pillar layer, and
the electric field concentration portion is disposed at a position shallower than the trap level region in the depth direction of the first pillar layer.

2. The semiconductor device according to claim 1, wherein the electric field concentration portion is disposed not less than 10 µm away from the trap level region in the depth direction of the first pillar layer.

3. The semiconductor device according to claim 1, wherein the first pillar layer is divided vertically by interposing, at an intermediate portion in its depth direction, a dividing region constituted of a portion of the semiconductor layer, and
the electric field concentration portion is disposed in the dividing region.

4. The semiconductor device according to claim 3, wherein
the first pillar layer includes a plurality of the first pillar layers aligned along the front surface of the semiconductor layer;
a second pillar layer of the first conductivity type is disposed, in the semiconductor layer, between the plurality of first pillar layers; and
charge balance of the first pillar layers and the second pillar layer is secured.

5. The semiconductor device according to claim 4, wherein
each of the first pillar layers has a width of 2 µm to 6 µm and an impurity concentration of $3\times10^{15}$ cm$^{-3}$ to $8\times10^{15}$ cm$^{-3}$, and
the second pillar layer has a width of 2 µm to 10 µm and an impurity concentration of $1\times10^{15}$ cm$^{-3}$ to $3\times10^{15}$ cm$^{-3}$.

6. The semiconductor device according to claim 1, wherein the charged particles include any of protons, deuterium, ³He++, and ⁴He++.

7. The semiconductor device according to claim 1, wherein the first pillar layer is formed in a stripe shape.

8. The semiconductor device according to claim 1, further comprising a collector region of the second conductivity type, disposed selectively at the rear surface of the semiconductor layer.

9. The semiconductor device according to claim 1, wherein the gate electrode includes a planar gate electrode.

10. The semiconductor device according to claim 1, wherein the gate electrode includes a trench gate electrode.

11. A semiconductor device comprising:
a semiconductor layer, having a drain region of a first conductivity type at a rear surface side;
a body region of a second conductivity type, disposed at a front surface portion of the semiconductor layer;
a source region of the first conductivity type, disposed at a front surface portion of the body region;
a gate electrode, facing the body region;
a gate insulating film, between the body region and the gate electrode;
a first pillar layer of the second conductivity type, disposed inside the semiconductor layer so as to be continuous to the body region and extending from the body region toward the rear surface of the semiconductor layer; and
a trap level region, disposed inside the semiconductor layer and containing charged particles that form a trap level; and
wherein an electric field concentration portion, where an electric field concentrates in an off state in which a channel is not formed in the body region, and the trap level region are disposed at mutually different depth positions in a depth direction of the first pillar layer,
the first pillar layer is divided vertically by interposing, at an intermediate portion in its depth direction, a dividing region constituted of a portion of the semiconductor layer, and
the electric field concentration portion is disposed in the dividing region.

12. A semiconductor device comprising:
a semiconductor layer, having a drain region of a first conductivity type at a rear surface side;
a body region of a second conductivity type, disposed at a front surface portion of the semiconductor layer;
a source region of the first conductivity type, disposed at a front surface portion of the body region;
a gate electrode, facing the body region;

a gate insulating film, between the body region and the gate electrode;

a first pillar layer of the second conductivity type, disposed inside the semiconductor layer so as to be continuous to the body region and extending from the body region toward the rear surface of the semiconductor layer; and a trap level region, disposed inside the semiconductor layer and containing charged particles that form a trap level; and wherein an electric field concentration portion, where an electric field concentrates in an off state in which a channel is not formed in the body region, and the trap level region are disposed at mutually different depth positions in a depth direction of the first pillar layer, a center of the electric field concentration portion overlaps a connection portion between a rear surface-side end portion of the first pillar layer and the semiconductor layer in a vertical direction, and the trap level region is away from a part of the electric field concentration portion in which most electric field is concentrated.

\* \* \* \* \*